US011158829B2

(12) United States Patent
Sasada et al.

(10) Patent No.: US 11,158,829 B2
(45) Date of Patent: Oct. 26, 2021

(54) METHOD FOR PRODUCING A COMPOSITION FOR A LIGHT-EMITTING ELEMENT AND METHOD FOR EVALUATING SAME

(71) Applicant: Sumitomo Chemical Company, Limited, Tokyo (JP)

(72) Inventors: Toshiaki Sasada, Tsukuba (JP); Ryuji Matsumoto, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/642,475

(22) PCT Filed: May 16, 2019

(86) PCT No.: PCT/JP2019/019575

§ 371 (c)(1),
(2) Date: Feb. 27, 2020

(87) PCT Pub. No.: WO2019/225483

PCT Pub. Date: Nov. 28, 2019

(65) Prior Publication Data

US 2021/0175454 A1 Jun. 10, 2021

(30) Foreign Application Priority Data

May 21, 2018 (JP) ............................ JP2018-096865
Aug. 10, 2018 (JP) ............................ JP2018-151685

(51) Int. Cl.
*H01L 51/50* (2006.01)
*H01L 51/00* (2006.01)
*H01L 51/56* (2006.01)

(52) U.S. Cl.
CPC ...... *H01L 51/5004* (2013.01); *H01L 51/0031* (2013.01); *H01L 51/56* (2013.01); *H01L 51/008* (2013.01); *H01L 51/0039* (2013.01); *H01L 51/0043* (2013.01); *H01L 51/0052* (2013.01); *H01L 51/0055* (2013.01); *H01L 51/0058* (2013.01); *H01L 51/0071* (2013.01); *H01L 51/0072* (2013.01); *H01L 51/0074* (2013.01); *H01L 2251/552* (2013.01); *H01L 2251/556* (2013.01)

(58) Field of Classification Search
CPC ............... H01L 51/0085; H01L 51/009; H01L 51/0071; H01L 51/5092; H01L 51/0067; H05B 33/14
See application file for complete search history.

(56) References Cited

U.S. PATENT DOCUMENTS

2002/0028329 A1* 3/2002 Ise ...................... H01L 51/0059 428/336
2009/0015144 A1 1/2009 Takashima et al.
2010/0219397 A1* 9/2010 Watanabe ........... H01L 51/0085 257/40
2012/0206035 A1 8/2012 Shitagaki et al.
2012/0248968 A1 10/2012 Ogiwara et al.
2012/0309974 A1 12/2012 Cai et al.
2013/0193840 A1 8/2013 Soga et al.
2013/0270544 A1 10/2013 Anryu et al.
2015/0188070 A1 7/2015 Ogiwara et al.
2015/0236274 A1 8/2015 Hatakeyama et al.
2017/0320855 A1 11/2017 Wong et al.
2019/0010134 A1 1/2019 Sasada et al.
2019/0013481 A1 1/2019 Nasu et al.
2019/0058124 A1 2/2019 Hatakeyama et al.
2019/0214569 A1 7/2019 Sasada et al.
2020/0035922 A1 1/2020 Ogiwara et al.

FOREIGN PATENT DOCUMENTS

JP 2012036381 A 2/2012
JP 2012144722 A 8/2012
JP 5935199 B2 6/2016
JP 2018061030 A 4/2018
WO 2008059713 A1 5/2008

(Continued)

OTHER PUBLICATIONS

English Translation of International Preliminary Report on Patentability dated Dec. 3, 2020 in International Application No. PCT/JP2019/019575.
Extended European Search Report dated Oct. 22, 2020 in EP Application No. 19806403.2.
Tsai et al., "A versatile thermally activated delayed fluorescence emitter for both highly efficient doped and non-doped organic light emitting devices," Chemical Communications, vol. 51, No. 71, pp. 13662-13665 (2015).

(Continued)

*Primary Examiner* — Dung A. Le
(74) *Attorney, Agent, or Firm* — Panitch Schwarze Belisario & Nadel LLP

(57) ABSTRACT

A composition for a light-emitting element contains a host material and a guest material. The host material is a compound containing at least one of an aromatic hydrocarbon group and a heterocyclic group and the guest material is a compound having a condensed heterocyclic group containing at least one of a boron atom, an oxygen atom, a sulfur atom, a selenium atom, an $sp^3$ carbon atom, and a nitrogen atom in a ring. A difference ΔE between an energy value at the maximum peak of a emission spectrum of the host material at 25° C. and an energy value at a peak on the lowest energy side of an absorption spectrum of the guest material at 25° C. is 0.50 eV or less, and a difference ΔS between an energy value at the maximum peak of an emission spectrum of the guest material at 25° C. and an energy value at the maximum peak of an emission spectrum of the guest material at 77 K is 0.10 eV or less.

5 Claims, No Drawings

(56) References Cited

FOREIGN PATENT DOCUMENTS

| | | | |
|---|---|---|---|
| WO | 2011098030 | A1 | 8/2011 |
| WO | 2012102118 | A1 | 8/2012 |
| WO | 2012133188 | A1 | 10/2012 |
| WO | 2013109030 | A1 | 7/2013 |
| WO | 2014013947 | A1 | 1/2014 |
| WO | 2014102543 | A2 | 7/2014 |
| WO | 2015102118 | A1 | 7/2015 |
| WO | 2016152544 | A1 | 9/2016 |
| WO | 2017038613 | A1 | 3/2017 |
| WO | 2017115834 | A1 | 7/2017 |
| WO | 2017115934 | A1 | 7/2017 |
| WO | 2017138526 | A1 | 8/2017 |
| WO | 2017188111 | A1 | 11/2017 |
| WO | 2018062278 | A1 | 4/2018 |
| WO | 2018088573 | A1 | 5/2018 |
| WO | 2018181188 | A1 | 10/2018 |

OTHER PUBLICATIONS

English Translation of International Search Report dated Aug. 13, 2019 in International Application No. PCT/JP2019/019575.

Luminescence Technology Corp., "Product Introduction," 2 pages (2019).

Nakanotani et al., "High-efficiency organic light-emitting diodes with fluorescent emitters," Nature Communications, pp. 1-7 (2014).

Office Action dated Nov. 6, 2018 in JP Application No. P2018151685.

Zhang et al., "Supporting Information: Efficient blue organic light-emitting diodes employing thermally activated delayed fluorescence," Nature Phototonics, MacMillan Publishers Limited, pp. 1-18 (2014).

Decision to Grant dated Feb. 26, 2019 in JP Application No. P2018151685.

Office Action dated Oct. 26, 2020 in CN Application No. 201980004123.3.

* cited by examiner

METHOD FOR PRODUCING A COMPOSITION FOR A LIGHT-EMITTING ELEMENT AND METHOD FOR EVALUATING SAME

CROSS-REFERENCE TO RELATED APPLICATION

This application is a Section 371 of International Application No. PCT/JP2019/019575, filed May 16, 2019, which was published in the Japanese language on Nov. 28, 2019 under International Publication No. WO 2019/225483 A1, and claims priority under 35 U.S.C. § 119(b) to Japanese Application No. 2018-096865, filed May 21, 2018, and Japanese Application No. 2018-151685, filed Aug. 10, 2018, the disclosures of which are incorporated herein by reference in their entirety.

TECHNICAL FIELD

The present invention relates to a composition for a light-emitting element, a method for producing a composition for a light-emitting element, a method for evaluating a composition for a light-emitting element, a light-emitting element, and a method for producing a light-emitting element.

BACKGROUND ART

A light-emitting element such as organic electroluminescent element can be suitably used, for example, for display and lighting. As a light-emitting material used for a light-emitting layer of the light-emitting element, for example, a composition containing a compound (H-0) and a compound (E-1) is proposed in Patent Literature 1.

[Chemical Formula 1]

Compound (H-0)

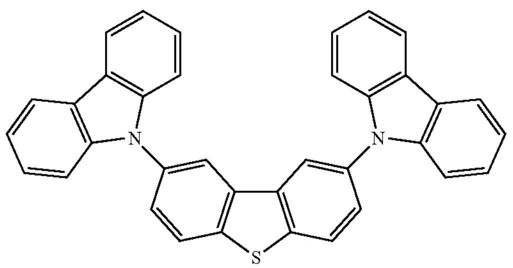

Compound (E-1)

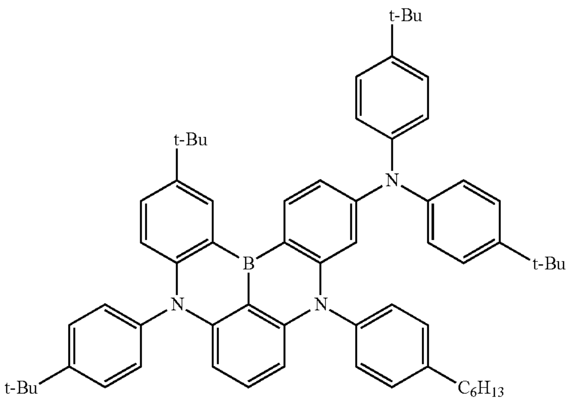

CITATION LIST

Patent Literature

Patent Literature 1: International Publication No. WO 2018/062278

SUMMARY OF INVENTION

Technical Problem

A light emitting element made from the composition described above, however, does not always have a sufficient luminance life.

An object of the present invention is, therefore, to provide a composition useful for producing a light emitting element excellent in luminance life.

Solution to Problem

As a result of intensive studies to solve the problem, the present inventors found that a composition for a light-emitting element comprising a specific host material and a specific guest material, with the maximum peak of the emission spectrum of the guest material satisfying a specific energy relationship, and the maximum peak of the emission spectrum of the host material and the peak on the lowest energy side of the absorption spectrum of the guest material satisfying a specific energy relationship, enables a light emitting element having an excellent luminance life to be formed, so that the present invention has been completed.

The present invention provides the following [1] to [12].

[1]

A composition for a light-emitting element, comprising:

a host material; and a guest material, wherein the host material is a compound comprising at least one selected from the group consisting of an aromatic hydrocarbon group and a heterocyclic group, the guest material is a compound having a condensed heterocyclic group comprising at least one selected from the group consisting of a boron atom, an oxygen atom, a sulfur atom, a selenium atom, an $sp^3$ carbon atom, and a nitrogen atom in a ring, a difference ΔE between an energy value at the maximum peak of an emission spectrum of the host material at 25° C. and an energy value at a peak on the lowest energy side of an absorption spectrum of the guest material at 25° C. is 0.50 eV or less, and a difference ΔS between an energy value at the maximum peak of an emission spectrum of the guest material at 25° C. and an energy value at the maximum peak of an emission spectrum of the guest material at 77 K is 0.10 eV or less.

[2]

The composition for a light-emitting element according to item [1], wherein the ΔE is 0.20 eV or less.

[3]

The composition for a light-emitting element according to item [1] or [2], wherein the ΔE is 0.010 eV or more.

[4]

The composition for a light-emitting element according to any one of items [1] to [3], wherein the ΔS is 0.050 eV or less.

[5]

The composition for a light-emitting element according to any one of items [1] to [4], wherein the guest material is a compound having a condensed heterocyclic group comprising a boron atom and a nitrogen atom in a ring.

[6]

The composition for a light-emitting element according to any one of items [1] to [5], further comprising at least one selected from the group consisting of a hole transport material, a hole injection material, an electron transport material, an electron injection material, a light emitting material, an antioxidant, and a solvent.

[7]

A light-emitting element comprising:

an anode;

a cathode; and a layer containing the composition for light emitting elements according to any one of items [1] to [6], the layer disposed between the anode and the cathode.

[8]

A method for producing a composition for a light-emitting element comprising:

a preparation step of preparing a host material, the host material being a compound comprising at least one selected from the group consisting of an aromatic hydrocarbon group and a heterocyclic group;

a selection step of selecting a guest material, the guest material being a compound having a condensed heterocyclic group comprising at least one selected from the group consisting of a boron atom, an oxygen atom, a sulfur atom, a selenium atom, an $sp^3$ carbon atom, and a nitrogen atom in a ring, wherein a difference ΔS between an energy value at the maximum peak of an emission spectrum at 25° C. and an energy value at the maximum peak of an emission spectrum at 77 K is 0.10 eV or less, and a difference ΔE between an energy value at a peak on the lowest energy side of an absorption spectrum at 25° C. and an energy value at the maximum peak of an emission spectrum of the host material at 25° C. is 0.50 eV or less; and a production step of mixing the host material and the guest material to obtain the composition for a light-emitting element.

[9]

The method for producing a composition for a light-emitting element according to item [8], further comprising a step of obtaining an energy value at the maximum peak of the emission spectrum of the host material at 25° C.

[10]

The method for producing a composition for a light-emitting element according to item [8] or [9], wherein the selection step comprises a step of obtaining an energy value at the peak on the lowest energy side of an absorption spectrum at 25° C., an energy value at the maximum peak of a light emitting spectrum at 25° C., and an energy value at the maximum peak of a light emitting spectrum at 77 K each of the compound having a condensed heterocyclic group to calculate the ΔE and the ΔS.

[11]

A method for producing a light-emitting element having an anode, a cathode, and a layer disposed between the anode and the cathode, the method comprising:

a step of producing a composition for a light-emitting element by the production method according to any one of items [8] to [10]; and a step of forming the layer by a dry method or a wet method using the composition for a light-emitting element produced in the step.

[12]

A method for evaluating a composition for a light-emitting element, the composition containing: a host material, the host material being a compound comprising at least one selected from the group consisting of an aromatic hydrocarbon group and a heterocyclic group; and a guest material, the guest material being a compound having a condensed heterocyclic group comprising at least one selected from the group consisting of a boron atom, an oxygen atom, a sulfur atom, a selenium atom, an $sp^3$ carbon atom, and a nitrogen atom in a ring, the method comprising:

a step of obtaining a difference ΔE between an energy value at the maximum peak of an emission spectrum of the host material at 25° C. and an energy value at a peak on the lowest energy side of an absorption spectrum of the guest material at 25° C.;

a step of obtaining a difference ΔS between an energy value at the maximum peak of an emission spectrum of the guest material at 25° C. and an energy value at the maximum peak of an emission spectrum of the guest material at 77 K; and a step of evaluating the composition for a light-emitting element based on the ΔE and the ΔS.

Advantageous Effects of Invention

According to the present invention, a composition useful for producing a light-emitting element excellent in luminance life can be provided. Also, according to the present invention, a light-emitting element containing the composition can be provided. Further, according to the present invention, a method for producing the composition and the light-emitting element and a method for evaluating the composition can be provided.

DESCRIPTION OF EMBODIMENTS

Embodiments of the present invention are described in detail as follows.

<Description of Common Terms>

Terms used in common in the present specification refer to the followings unless otherwise specified.

A term "room temperature" refers to 25° C.

Me represents a methyl group, Et represents an ethyl group, Bu represents a butyl group, i-Pr represents an isopropyl group, and t-Bu represents a tert-butyl group.

A hydrogen atom may be any one of a heavy hydrogen atom and a light hydrogen atom.

A term "polymer compound" refers to a polymer having a molecular weight distribution and a number average molecular weight of $1\times10^3$ to $1\times10^8$ in terms of polystyrene.

A term "low-molecular weight compound" refers to a compound having no molecular weight distribution and having a molecular weight of $1\times10^4$ or less.

An "alkyl group" may be straight-chain or branched. The number of carbon atoms in the straight-chain alkyl group is usually 1 to 50, preferably 1 to 20, more preferably 1 to 10, without including the number of carbon atoms in a substituent. The number of carbon atoms in a branched alkyl group is usually 3 to 50, preferably 3 to 20, and more preferably 4 to 10, without including the number of carbon atoms in the substituent. The alkyl group may have a substituent, and examples of the alkyl group include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group, a dodecyl group, a trifluoromethyl group, a pentafluoroethyl group, a perfluorobutyl group, a perfluorohexyl group, a perfluorooctyl group, a 3-phenylpropyl group, a 3-(4-methylphenyl) propyl group, a 3-(3,5-di-hexylphenyl)propyl group, and a 6-ethyloxyhexyl group.

The number of carbon atoms in a "cycloalkyl group" is usually 3 to 50, preferably 4 to 10, without, including the number of carbon atoms in a substituent. The cycloalkyl group may have a substituent, and examples thereof include a cyclohexyl group, a cyclohexylmethyl group, and a cyclohexylethyl group.

The number of carbon atoms in an "alkylene group" is usually 1 or more and 20 or less, preferably 1 or more and 15 or less, more preferably 1 or more and 10 or less, without including the number of carbon atoms in a substituent. The alkylene group may have a substituent, and examples thereof include a methylene group, an ethylene group, a propylene group, a butylene group, a hexylene group, and an octylene group.

The number of carbon atoms in a "cycloalkylene group" is usually 3 or more and 20 or less, without including the number of carbon atoms in a substituent. The cycloalkylene group may have a substituent and examples thereof include a cyclohexylene group.

An "aromatic hydrocarbon group" refers to a group having one or more hydrogen atoms directly bonding to carbon atoms to compose a ring removed from an aromatic hydrocarbon. The group having one hydrogen atom directly bonding to a carbon atom to compose a ring removed from an aromatic hydrocarbon is also referred to as an "aryl group". The group having two hydrogen atoms directly bonding to carbon atoms to compose a ring removed from an aromatic hydrocarbon is also referred to as an "arylene group".

The number of carbon atoms in the aromatic hydrocarbon group is usually 6 to 60, preferably 6 to 30, more preferably 6 to 18, without including the number of carbon atoms in a substituent.

Examples of the "aromatic hydrocarbon group" include a group having one or more hydrogen atoms directly bonding to carbon atoms to compose a ring removed from, for example, a monocyclic aromatic hydrocarbon (e.g., benzene) or a polycyclic aromatic hydrocarbon (e.g., a bicyclic aromatic hydrocarbon such as naphthalene and indene; a tricyclic aromatic hydrocarbon such as anthracene, phenanthrene, dihydrophenanthrene and fluorene; a tetracyclic aromatic hydrocarbon such as triphenylene, naphthacene, benzofluorene, pyrene, chrysene and fluoranthene; a pentacyclic aromatic hydrocarbon such as dibenzolluorene, perylene and benzofluoranthene; a hexacyclic aromatic hydrocarbon such as spirobifluorene; a heptacyclic aromatic hydrocarbon such as benzospirobifluorene and acenaphthofluoranthene; and an octacyclic aromatic hydrocarbon such as dibenzospirobifluorene), and these group may have a substituent. The aromatic hydrocarbon group includes a group comprising a plurality of these groups bonded.

An "alkoxy group" may be straight-chain or branched. The number of carbon atoms in the straight-chain alkoxy group is usually 1 to 40, preferably 1 to 10, without including the number of carbon atoms in a substituent. The number of carbon atoms in the branched alkoxy group is usually 3 to 40, preferably 4 to 10, without including the number of carbon atoms in a substituent. The alkoxy group may have a substituent, and examples of the alkoxy group include a methoxy group, an ethoxy group, a propyloxy group, an isopropyloxy group, a butyloxy group, an isobutyloxy group, a tert-butyloxy group, a pentyloxy group, a hexyloxy group, a heptyloxy group an octyloxy group, a 2-ethylhexyloxy group, a nonyloxy group, a decyloxy group, a 3,7-dimethyloctyloxy group, and a lauryloxy group.

The number of carbon atoms in a "cycloalkoxy group" is usually 3 to 40, preferably 4 to 10, without including the number of carbon atoms in a substituent. The cycloalkoxy group may have a substituent, and examples thereof include a cyclohexyloxy group.

The number of carbon atoms in an "aryloxy group" is generally 6 to 60, preferably 6 to 48, without including the number of carbon atoms in a substituent. The aryloxy group may have a substituent, and examples thereof include a phenoxy group, a 1-naphthyloxy group, a 2-naphthyloxy group, a 1-anthracertyloxy group, a 9-anthracenyloxy group, and a 1-pyrenyloxy group.

A term "heterocyclic group" refers to a group having one or more hydrogen atoms directly bonding to carbon atoms or hetero atoms to compose a ring removed from a heterocyclic compound. Among the heterocyclic groups, an "aromatic heterocyclic group" which is a group having one or more hydrogen atoms directly bonding to carbon atoms or hetero atoms to compose a ring removed from an aromatic heterocyclic compound is preferred. A group having p number of hydrogen atoms (p representing an integer of 1 or more) directly bonding to carbon atoms or hetero atoms to compose a ring removed from a heterocyclic compound is also referred to as a "p-valent heterocyclic group". A group having p number of hydrogen atoms directly bonding to carbon atoms or hetero atoms to compose a ring removed from an aromatic heterocyclic compound is also referred to as a "p-valent aromatic heterocyclic group".

Examples of an "aromatic heterocyclic compound" include a compound with a heterocycle itself exhibiting aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, and dibenzophosphole; and a compound with a heterocycle itself exhibiting no aromaticity, condensed with an aromatic ring, such as phenoxazine, phenothiazine, dibenzoborol, dibenzosilol, and benzopyran.

The number of carbon atoms in the heterocyclic group is usually 1 to 60, preferably 2 to 40, and more preferably 3 to 20, without including the number of carbon atoms in a substituent. The number of hetero atoms in the aromatic heterocyclic group is usually 1 to 30, preferably 1 to 10, more preferably 1 to 5, still more preferably 1 to 3, without including the number of carbon atoms in a substituent.

The heterocyclic group may have a substituent, and examples thereof include a group having one or more hydrogen atoms directly bonding to the atoms to compose a ring removed from, for example, a monocyclic heterocyclic compound (e.g., furan, thiophene, pyrrole, diazole, triazole, pyridine, diazabenzene and triazine) or a polycyclic heterocyclic compound (e.g., a bicycle heterocyclic compound such as azanaphthalene, diazanaphthalene, benzofuran, indole, benzodiazole and benzothiadiazole; a tricyclic heterocyclic compound such as dibenzofuran, dibenzothiophene, dibenzoborole, dibenzosilole, dibenzophosphole, dibenzothiselenophene, phenoxazine, phenothiazine, 9,10-dihydroacridine, 5,10-dihydrophenazine, phenazaborine, phenophosphazine, phenoselenazine, phenazacillin, azaanthracene, diazaanthracene, azaphenanthrene and diazaphenanthrene; a tetracyclic heterocyclic compound such as hexaazatriphenylene, benzoindole and benzonaphthofuran; a pentacyclic heterocyclic compounds such as dibenzocarbazole, indolocarbazole and indenocarbazole; a hexacyclic heterocyclic compound such as carbazolocarbazole, benzoindolocarbazole and benzoindenocarbazole; and a heptacyclic heterocyclic compound such as dibenzoindolocarbazole); and these groups may have a substituent. The heterocyclic group includes a group comprising a plurality of these groups bonded.

A term "halogen atom" refers to a fluorine atom, a chlorine atom, a bromine atom or an iodine atom.

An "amino group" may have a substituent, and a substituted amino group is preferred. As a substituent which an amino group has, an alkyl group, a cycloalkyl group an aryl group or a monovalent heterocyclic group is preferred.

Examples of the substituted amino group include a dialkylamino group, dicycloalkylamino group and a diarylamino group.

Examples of the amino group include a dimethylamino group, a diethylamino group, a diphenylamino group, a bis(4-methylphenyl)amino group, a bis(4-tert-butylphenyl)amino group, and a bis(3,5-di-tert-butylphenyl)amino group.

An "alkenyl group" may be straight-chain or branched. The number of carbon atoms in the straight-chain alkenyl group is usually 2 to 30, preferably 3 to 20, without including the number of carbon atoms in a substituent. The number of carbon atoms in a branched alkenyl group is usually 3 to 30, preferably 4 to 20, without including the number of carbon atoms in a substituent.

The number of carbon atoms in a "cycloalkenyl group" is usually 3 to 30, preferably 4 to 20, without including the number of carbon atoms in a substituent.

The alkenyl group and the cycloalkenyl group may have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and any of these groups having a substituent.

An "alkynyl group" may be straight-chain or branched. The number of carbon atoms in the alkynyl group is usually 2 to 20, preferably 3 to 20, without including the carbon atoms in a substituent. The number of carbon atoms in the branched alkynyl group is usually 4 to 30, preferably 4 to 20, without including the carbon atoms in a substituent.

The number of carbon atoms in a "cycloalkynyl group" is usually from 4 to 30, preferably 4 to 20, without including the carbon atoms in a substituent.

The alkynyl group and the cycloalkynyl group may have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and any of these groups having a substituent.

A term "cross-linkable group" is a group capable of producing a new bond when subjected to heating, ultraviolet irradiation, near-ultraviolet irradiation, visible light irradiation, infrared irradiation, a radical reaction, or the like, and preferably a group represented by any one of formulas (B-1) to (B-17). These groups may have a substituent.

[Chemical Formula 2]

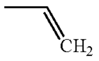

(B-1)

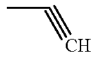

(B-2)

-continued

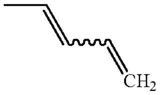

(B-3)

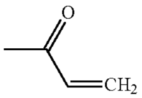

(B-4)

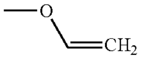

(B-5)

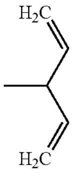

(B-6)

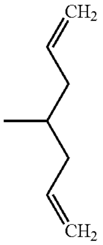

(B-7)

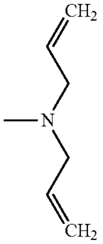

(B-8)

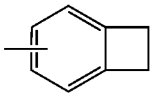
(B-9)

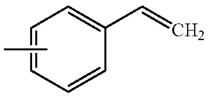

(B-10)

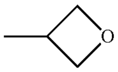

(B-11)

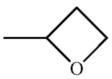

(B-12)

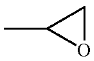

(B-13)

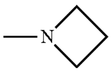

(B-14)

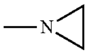

(B-15)

-continued (B-16)

$-N_3$ (B-17)

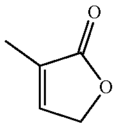

A term "substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group, or a cycloalkynyl group. The substituent may be a cross-linkable group. When a plurality of substituents are present, they may be bonded to each other to form a ring together with the atoms to which they are bonded, though it is preferable that no ring be formed.

<Composition for Light-Emitting Element>

The composition for a light-emitting element in the present embodiment contains a host material and a guest material.

In the composition for a light-emitting element in the present embodiment, the host material and the guest material each may comprise only one type, or two or more types.

In the composition for light-emitting elements in the present embodiment, the content of the guest material is usually 0.01 to 99 parts by mass relative to the total 100 parts by mass of the host material and the guest material, and for achievement of more excellent luminance life of the light-emitting element in the present embodiment, preferably 0.05 to 50 parts by mass, more preferably 0.1 to 30 parts by mass, still more preferably 0.5 to 5 parts by mass, particularly preferably 0.8 to 2 parts by mass.

In the composition for a light-emitting element in the present embodiment, the difference ΔE between the energy value at the maximum peak of the emission spectrum of the host material at room temperature (25° C.) and the energy value at the peak on the lowest energy side of the absorption spectrum of the guest material at room temperature (25° C.) is preferably 0.20 eV or less, more preferably 0.15 eV or less, for achievement of more excellent luminance life of the light-emitting element in the present embodiment. The ΔE may be 0.13 eV or less, 0.10 eV or less, or 0.08 eV or less. The ΔE may be 0 eV or more, 0.001 eV or more, 0.01 eV or more, 0.03 eV or more, or 0.05 eV or more. In this specification, the difference ΔE represents an absolute value of the difference.

In the composition for a light-emitting element in the present embodiment, when the energy value at the maximum peak of the emission spectrum of the host material at room temperature (25° C.) is taken as EH and the energy value at the peak on the lowest energy side of the absorption spectrum of the guest material at room temperature (25° C.) is taken as EG, the value of EH-EG (hereinafter, also referred to as "EH-EG") is usually −0.50 eV or more, and for achievement of more excellent luminance life of the light-emitting element in the present embodiment, preferably −0.10 eV or more, more preferably −0.07 eV or more, still more preferably −0.05 eV or more. Also, EH-EG is usually 0.50 eV or less, and for achievement of more excellent luminance life of the light-emitting element in the present embodiment, preferably 0.20 eV or less, more preferably 0.15 eV or less, still more preferably 0.13 eV or less, particularly preferably 0.10 eV or less, most particularly preferably 0.08 eV or less.

In the composition for a light-emitting element in the present embodiment, the difference ΔS between the energy value at the maximum peak of the emission spectrum of the guest material at room temperature (25° C.) and the energy value at the maximum peak of the emission spectrum of the guest material at 77 K is usually 0.10 eV or less, and for achievement of more excellent luminance life of the light-emitting element in the present embodiment, preferably 0.050 eV or less. Also, ΔS may be 0.040 eV or less. Also, ΔS may be 0.005 eV or more, 0.010 eV or more, or 0.020 eV or more. In the present specification, the difference ΔS represents an absolute value of the difference.

In the composition for a light-emitting element in the present embodiment, the maximum peak wavelength of the emission spectrum of the guest material at room temperature (25° C.) is preferably 380 nm or more and 495 nm or less, more preferably 400 nm or more and 485 nm or less, still more preferably 420 nm or more and 475 nm or less.

In the composition for a light-emitting element in the present embodiment, the peak wavelength on the lowest energy side of the absorption spectrum of the guest material at room temperature (25° C.) is preferably 360 nm or more and 490 nm or less, more preferably 380 nm or more and 480 nm or less, still more preferably 400 nm or more and 470 nm or less.

In the composition for a light-emitting element in the present embodiment, the energy value of the full width at half maximum of the peak on the lowest energy side of the absorption spectrum of the guest material at room temperature (25° C.) is preferably 0.50 eV or less, more preferably 0.30 eV or less, still more preferably 0.20 eV or less. The energy value of the full width at half maximum of the peak on the lowest energy side of the absorption spectrum of the guest material at room temperature (25° C. may be 0.001 eV or more, 0.01 eV or more, or 0.10 eV or more.

It is presumed that the relations among ΔS, ΔE, and emission properties of a light-emitting element (in particular, luminance life) are as follows.

The present inventors found that the full width at half maximum of the absorption spectrum of the guest material decreases by setting ΔS to 0.10 eV or less. Thus, a guest material having a small full width at half maximum of the emission spectrum can be obtained. However, as the full width at half maximum of the absorption spectrum of the guest material decreases, the overlap between the emission spectrum of the host material and the absorption spectrum of the guest material decreases. The inventors of the present invention therefore assumed that the overlap between the emission spectrum of the host material and the absorption spectrum of the guest material needs to be increased, and focused on ΔE. More specifically, by setting ΔE to 0.50 eV or less, the overlap between the emission spectrum of the host material and the absorption spectrum of the guest material increases to rapidly move the excitation energy of the host material to the guest material, so that deterioration of the host material can be prevented. It is presumed that excellent emission properties of the light-emitting element (luminance life, in particular) can therefore be obtained.

The energy value of the maximum peak of the emission spectrum of the compound and the energy value of the peak on the lowest energy side of the absorption spectrum can be obtained by measuring the maximum peak wavelength of the emission spectrum of the compound and the peak wavelength of the lowest energy side of the absorption spectrum, and then converting the peak wavelengths obtained into energy values.

The maximum peak wavelength of the emission spectrum of a compound at room temperature can be evaluated by dissolving the compound in an organic solvent such as xylene, toluene, chloroform, tetrahydrofuran, and 2-methyltetrahydrofuran to prepare a dilute solution ($1\times10^{-6}$ mass % to $1\times10^{-3}$ mass %) and measuring the PL spectrum of the dilute solution at room temperature. As the organic solvent for dissolving the compound, xylene or 2-methyltetrahydrofuran is preferred.

The maximum peak wavelength of the emission spectrum of the compound at 77 K can be evaluated by dissolving the compound in an organic solvent such as xylene, toluene, chloroform, tetrahydrofuran, and 2-methyltetrahydrofuran to prepare a dilute solution ($1\times10^{-6}$ mass % to $1\times10^{-3}$ mass %), and measuring the PL spectrum of the dilute solution at 77 K. As the organic solvent for dissolving the compound, 2-methyltetrahydrothran is preferred.

The peak wavelength on the lowest energy side of the absorption spectrum of the compound at room temperature can be evaluated by dissolving the compound in an organic solvent such as xylene, toluene, chloroform, tetrahydrofuran, and 2-methyltetrahydrofutan to prepare a dilute solution ($1\times10^{-6}$ mass % to $1\times10^{-3}$ mass %), and measuring the ultraviolet visible absorption spectrum of the dilute solution at room temperature. As the organic solvent for dissolving the compound, xylene is preferred.

[Host Material]

The host material refers to a material for transferring electric energy to the guest material. In the case of light-emitting material as an example, electric energy is efficiently transferred from the host material to the guest material, so that the guest material can emit light more efficiently.

The host material may be a polymer compound (hereinafter also referred to as a "polymer host material") or a low-molecular weight compound (hereinafter also referred to as a "low-molecular weight host material"), and a low-molecular weight host material is preferred.

The molecular weight of the low-molecular weight host material is usually $1\times10^{2}$ to $1\times10^{4}$, preferably $2\times10^{2}$ to $5\times10^{3}$, more preferably $3\times10^{2}$ to $3\times10^{3}$, and still more preferably $4\times10^{2}$ to $1.5\times10^{3}$. It is preferable that the low-molecular weight host material be a compound having no molecular weight distribution.

The total number of the aromatic hydrocarbon groups and the aromatic heterocyclic groups contained in the low-molecular weight host material is usually 1 to 30, and for achievement of more excellent luminance life of the light-emitting element in the present embodiment, preferably 1 to 20, more preferably 1 to 15, still more preferably 1 to 10.

For achievement of more excellent luminance life of the light-emitting element in the present embodiment, the low-molecular weight host material is preferably a compound represented by formula (H-1).

[Chemical Formula 3]

$$\mathrm{Ar}^{H1}-\left[\left[\mathrm{L}^{H2}\right]_{n^{H2}}\left[\mathrm{L}^{H1}\right]_{n^{H1}}\left[\mathrm{L}^{H2}\right]_{n^{H2}}\right]_{n^{H3}}-\mathrm{Ar}^{H2} \qquad \text{(H-1)}$$

wherein $Ar^{H1}$ and $Ar^{H2}$ each independently represent an aryl group or a monovalent heterocyclic group, and these groups may have a substituent;

$n^{H1}$ and $n^{H2}$ each independently represent 0 or 1; in the case where a plurality of $n^{H1}$ and $n^{H2}$ are present, they may be the same or different from each other;

$n^{H3}$ represents an integer of 0 or more;

$L^{H1}$ represents an arylene group, a divalent heterocyclic group, an alkylene group or a cycloalkylene group, and these groups may have a substituent; in the case where a plurality of $L^{H1}$ are present, they may be the same or different from each other;

$L^{H2}$ represents a group represented by —N($R^{H21}$)—; in the case where a plurality of $L^{H2}$ are present, they may be the same or different from each other;

$R^{H21}$ represents a hydrogen atom, an alkyl group, a cycloalkyl group, an aryl group or a monovalent heterocyclic group, and these groups may have a substituent.

Examples of the aryl group and the monovalent heterocyclic group in $Ar^{H1}$ and $Ar^{H2}$ include a group having one hydrogen atom directly bonding to an atom to compose a ring removed from, for example, benzene, naphthalene, anthracene, phenanthrene, dibydrophenanthrene, triphenylene, fluorene, benzofluorene, spirobifluorene, benzospirobifluorene, pyrene, chrysene, pyridine, diazahenzene, triazine, carbazole, azacarbazole, diazacarbazole, azanaphthalene, diazanaphthalene, dibenzofuran, dibenzothiophene, phenoxazine, phenothiazine, and 9,10-dihydroacridine, 5,10-dihydrophenazine, azaanthracene, diazaanthracene, azaphenanthrene, diazaphenanthrene, indolocarbazole or indenocarbazole; and for achievement of more excellent luminance life of the light-emitting element in the present embodiment, preferably, a group having one hydrogen atom directly bonding to an atom to compose a ring removed from benzene, naphthalene, anthracene, phenanthrene, fluorene, spirobifluorene, pyrene, pyridine, diazahenzene, triazine, azanaphthalene, diazanaphthalene, carbazole, azacarbazole, dibenzofuran, dibenzothiophene, phenoxazine, phenothiazine, indolocarbazole or indenocarbazole; more preferably, a group having one hydrogen atom directly bonding to an atom to compose a ring removed from benzene, naphthalene, anthracene, fluorene, spirobifluorene, pyridine, diazabenzene, triazine, carbazole, dibenzofiran or dibenzothiophene; and still more preferably, a group having one hydrogen atom directly bonding to an atom to compose a ring removed from benzene or carbazole; and these groups may have a substituent.

Examples of the substituent which $Ar^{H1}$ and $Ar^{H2}$ may have include, preferably a halogen atom, an alkyl group, a cycloalkyl group, an alkoxy group, a cycloalkoxy group, an aryl group, a monovalent heterocyclic group or a substituted amino group; more preferably an alkyl group, a cycloalkyl group, an aryl group or a monovalent heterocyclic group; still more preferably an alkyl group or a cycloalkyl group; and the groups may further have a substituent.

Examples and preferred ranges of the aryl group and the monovalent heterocyclic group in the substituents which $Ar^{H1}$ and $Ar^{H2}$ may have are the same as the examples and the preferred ranges of the aryl group and the monovalent heterocyclic group in $Ar^{H1}$ and $Ar^{H2}$, respectively.

In the substituted amino group in the substituents which $Ar^{H1}$ and $Ar^{H2}$ may have, the substituent which the amino group has is preferably an aryl group or a monovalent heterocyclic group, more preferably an aryl group, and these groups may further have a substituent. Examples and preferred ranges of the aryl group and the monovalent heterocyclic group in the substituents which the amino group has are the same as the examples and the preferred ranges of the aryl group and the monovalent heterocyclic group in $Ar^{H1}$ and $Ar^{H2}$, respectively.

Examples of a substituent which the substituent which $Ar^{H1}$ and $Ar^{H2}$ may have may further have include, preferably a halogen atom, an alkyl group, a cycloalkyl group, an alkoxy group, a cycloalkoxy group, an aryl group, a monovalent heterocyclic group and a substituted amino group, more preferably an alkyl group, a cycloalkyl group, an aryl group and a monovalent heterocyclic group, still more preferably an alkyl group and a cycloalkyl group, and these groups may further have a substituent, though having no further substituent is preferred.

Examples and preferred ranges of the aryl group, the monovalent heterocyclic group, and the substituted amino group in the substituents which the substituent which $Ar^{H1}$ and $Ar^{H2}$ may have may further have are the same as the examples and the preferred ranges of the aryl group, the monovalent heterocyclic group, and the substituted amino group in the substituents which $Ar^{H1}$ and $Ar^{H2}$ may have, respectively.

$n^{H1}$ is preferably 1. $n^{H2}$ is preferably 0.

$n^{H3}$ is usually an integer of 0 or more and 10 or less, preferably an integer of 0 or more and 5 or less, more preferably an integer of 1 or more and 3 or less, still more preferably 2.

It is preferable that $L^{H1}$ be an arylene group or a divalent heterocyclic group for achievement of more excellent luminance life of the light-emitting element in the present embodiment.

Examples of $L^{H1}$ include a group having two hydrogen atoms directly bonding to atoms to compose a ring removed from benzene, naphthalene, anthracene, phenanthrene, dihydrophenanthrene, triphenylene, fluorene, benzofluorene, spirobifluorene, benzospirobifluorene, pyrene, chrysene, pyridine, diazabenzene, triazine, carbazole, azacarbazole, diazacarbazole, azanaphthalene, diazanaphthalene, dibenzofuran, dibenzothiophene, phenoxazine, phenothiazine, 9,10-dihydroacridine, and 5,10-dihydrophenazine, azaanthracene, diazaanthracene, azaphenanthrene, diazaphenanthrene, indolocarbazole or indenocarbazole; preferably a group having two hydrogen atoms directly bonding to atoms to compose a ring removed from benzene, naphthalene, anthracene, phenanthrene, fluorene, spirobilluorene, pyrene, pyridine, diazabenzene, triazine, azanaphthalene, diazanaphthalene, carbazole, azacarbazole, dibenzofuran, dibenzothiophene, phenoxazine, phenothiazine, indolocarbazole or indenocarbazole; more preferably a group having one hydrogen atom directly bonding to an atom to compose a ring removed from benzene, naphthalene, anthracene, fluorene, spirobifluorene, pyridine, diazabenzene, triazine, carbazole, dibenzofuran, or dibenzothiophene; still more preferably a group having two hydrogen atoms directly bonding to atoms to compose a ring removed from benzene, naphthalene, anthracene, carbazole, dibenzofuran or dibenzothiophene; and these groups may have a substituent.

Examples of the substituent which $L^{H1}$ may have include preferably a halogen atom, an alkyl group, a cycloalkyl group, an alkoxy group, a cycloalkoxy group, an aryl group, a monovalent heterocyclic group and a substituted amino group; more preferably an alkyl group, an alkoxy group, an aryl group and a monovalent heterocyclic group; still more preferably an alkyl group, an aryl group and a monovalent heterocyclic group, and these groups may further have a substituent.

Examples and preferred ranges of the aryl group, the monovalent heterocyclic group and the substituted amino group in the substituents which $L^{H1}$ may have are the same as the examples and the preferred ranges of the aryl group, the monovalent heterocyclic group and the substituted amino group in the substituents which $Ar^{H1}$ and $Ar^{H2}$ may have, respectively.

Examples and preferred ranges of the substituent, which the substituent which the substituent which $L^{H1}$ may have may have, may further have, are the same as the examples and the preferred ranges of the substituent which the substituent which $Ar^{H1}$ and $Ar^{H2}$ may have may further have, respectively.

It is preferable that $R^{H21}$ be an aryl group or a monovalent heterocyclic group, and these groups may have a substituent.

The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$.

The definition and examples of the substituent which $R^{H21}$ may have are the same as the definition and examples of the substituent which $Ar^{H1}$ and $Ar^{H2}$ may have.

It is preferable that the compound represented by formula (H-1) be a compound represented by formula (H-2).

[Chemical Formula 4]

$$Ar^{H1} \left[ L^{H1} \right]_{n^{H3}} Ar^{H2} \quad \text{(H-2)}$$

wherein $Ar^{H1}$, $Ar^{H2}$ $n^{H3}$ and $L^{H1}$ each have the same meaning as described above.

Examples of the low-molecular weight host material include compounds represented by the following formulas, and a compound H2, a compound H3 and a compound H4 to be described below

[Chemical Formula 5]

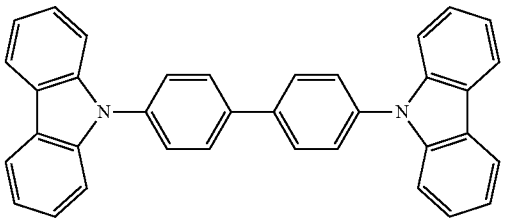

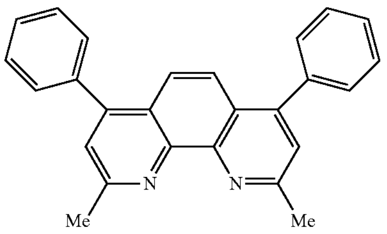

-continued
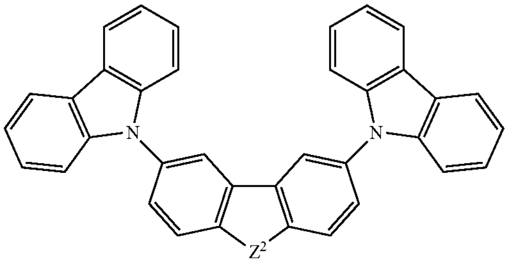
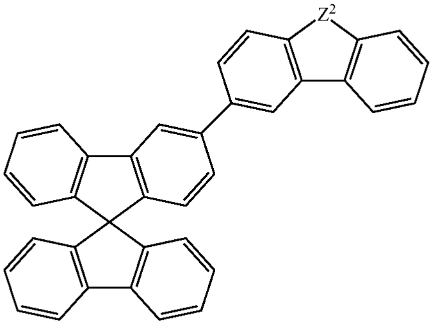
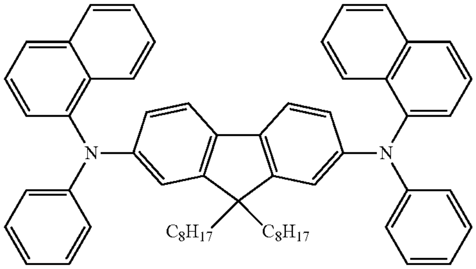
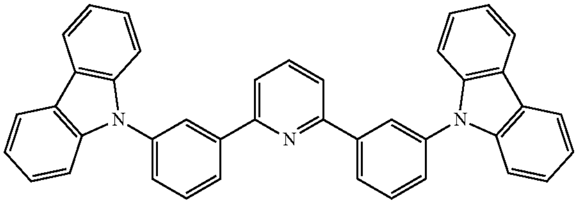
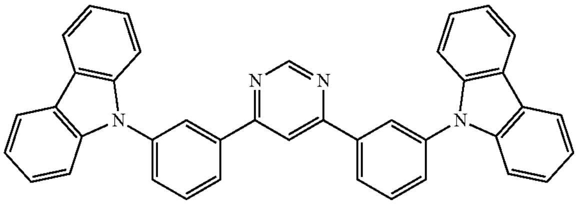
[Chemical Formula 6]
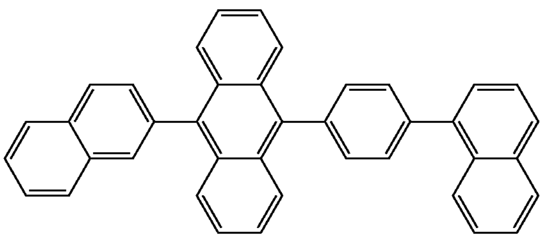
-continued
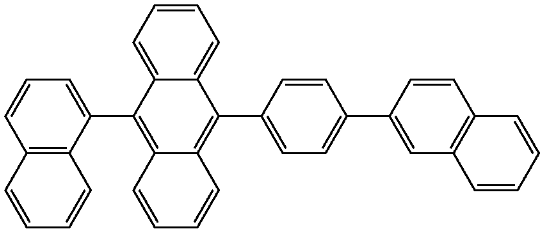
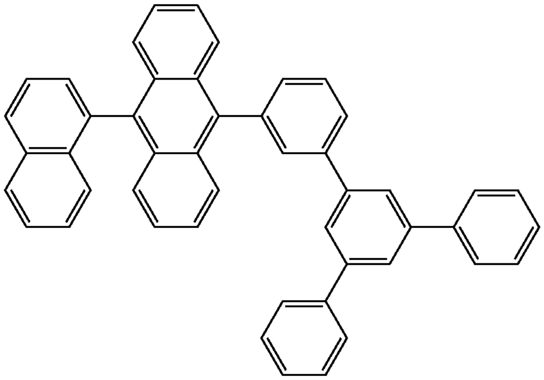
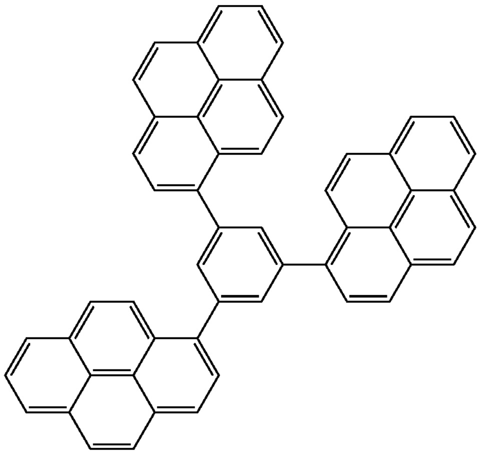
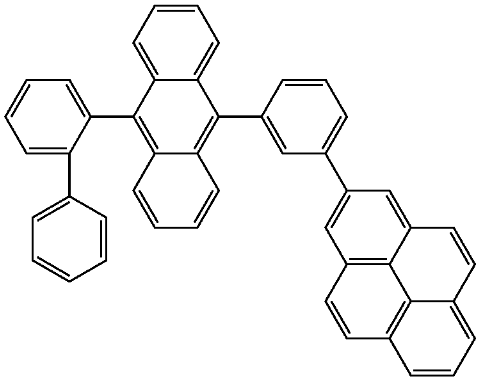

-continued
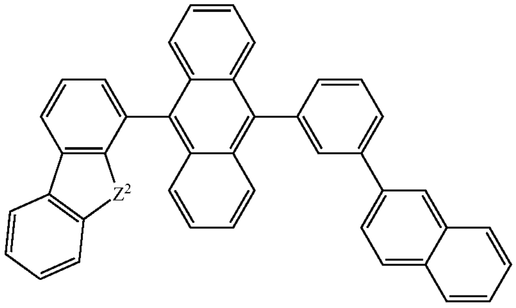
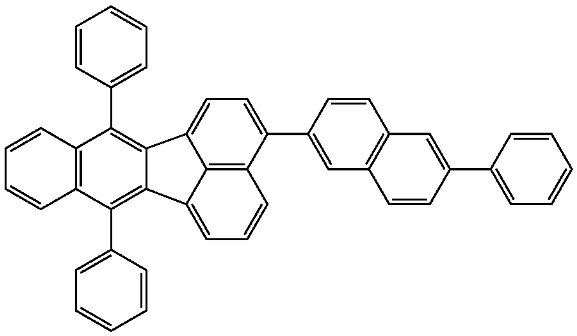
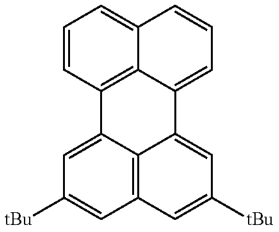
[Chemical Formula 7]
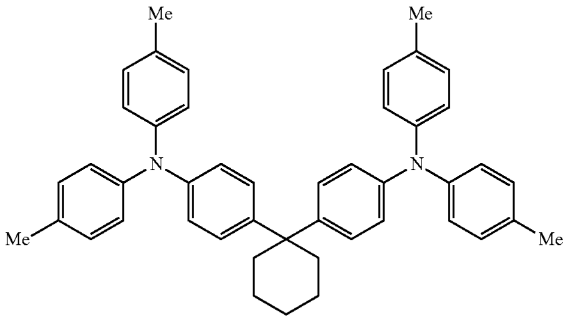
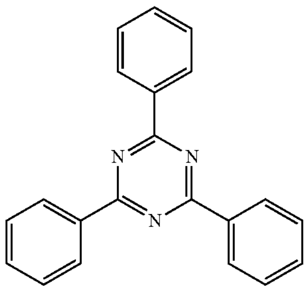
-continued
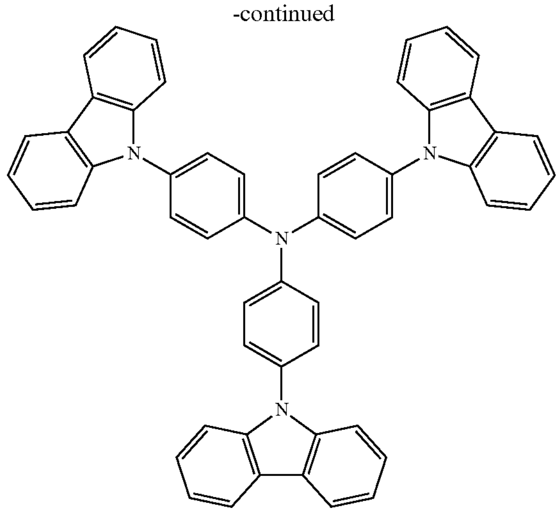
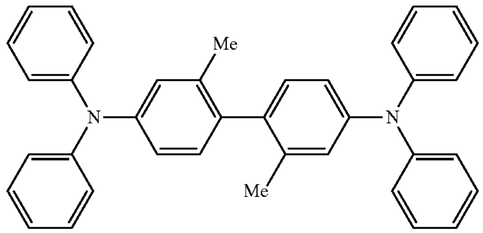
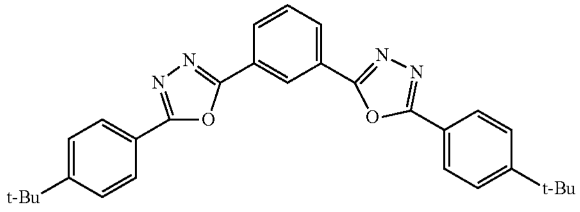
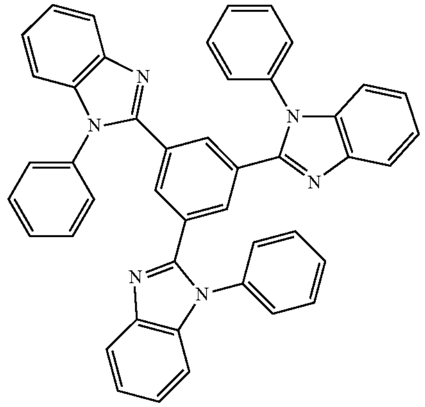
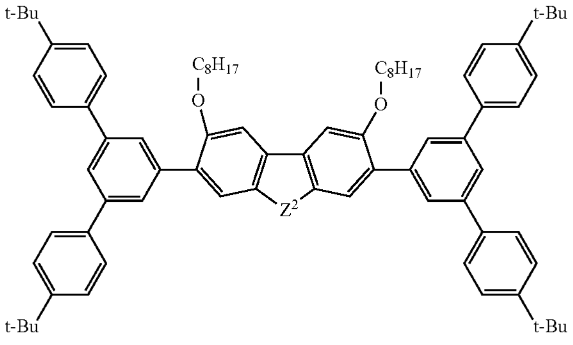
wherein $Z^2$ represents an oxygen atom or a sulfur atom.

Examples of the polymer host material includes a polymer compound as hole transport material to be described below, and a polymer compound as electron transport material to be described below.

The number average molecular weight of the polymer host material in terms of polystyrene is preferably $5\times10^3$ to $1\times10^6$, more preferably $1\times10^4$ to $5\times10^5$, still more preferably $5\times10^4$ to $2\times10^5$. The weight average molecular weight of the polymer host material in terms of polystyrene is preferably $1\times10^4$ to $2\times10^6$, more preferably $2\times10^4$ to $1\times10^6$, still more preferably $1\times10^5$ to $5\times10^5$.

The polymer host material may be any of a block copolymer, a random copolymer, an alternating copolymer, and a graft copolymer, or may be in other forms, though it is preferable that the polymer host material be a copolymer obtained by copolymerizing a plurality of types of raw material monomers.

The polymer host material is preferably a polymer compound containing an arylene group which may have a substituent or a divalent heterocyclic group which may have a substituent, and more preferably a. polymer compound containing an arylene group which may have a substituent.

The arylene group and the divalent heterocyclic group which the polymer host material may contain is preferably a group having two hydrogen atoms directly bonding to atoms to compose a ring removed from benzene, naphthalene, anthracene, phenanthrene, fluorene, spirobifluorene, pyrene, pyridine, diazabenzene, triazine, azanaphthalene, diazanaphthalene, carbazole, azacarbazol, dibenzofuran, dibenzothiophene, phenoxazine, phenothiazine, indolocarbazole or indenocarbazole; more preferably a group having one hydrogen atom directly bonding to an atom to compose a ring removed from benzene, naphthalene, anthracene, fluorene, spirobifluorene, pyridine, diazabenzene, triazine, carbazole, dibenzoturan or dibenzothiophene; and more preferably a group having two hydrogen atoms directly bonding to atoms to compose a ring removed from benzene, naphthalene, anthracene, fluorene or spirobifluorene, and these groups may have a substituent.

In the polymer host material, examples and preferred range of the substituent which the arylene group and the divalent heterocyclic group may have are the same as the examples and the preferred ranges of the substituent which $L^{H1}$ may have, respectively.

Examples of the polymer host material include polymer compounds comprising structural units represented by the following formulas.

[Chemical Formula 8]

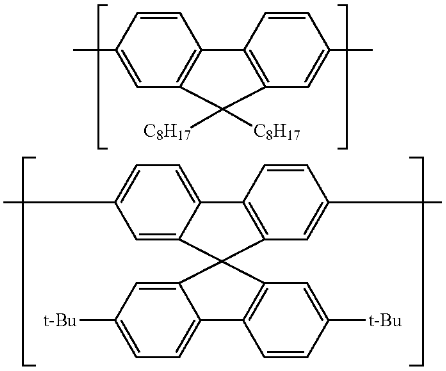

-continued

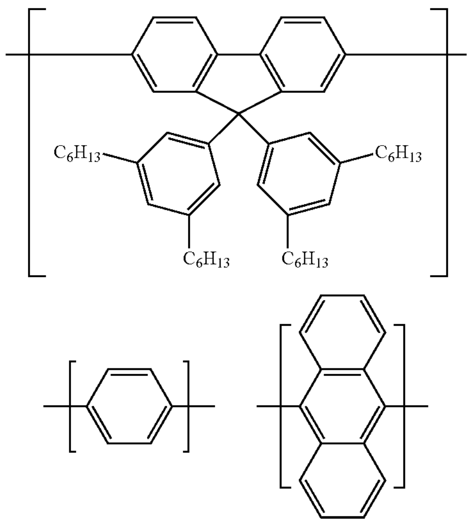

[Chemical Formula 9]

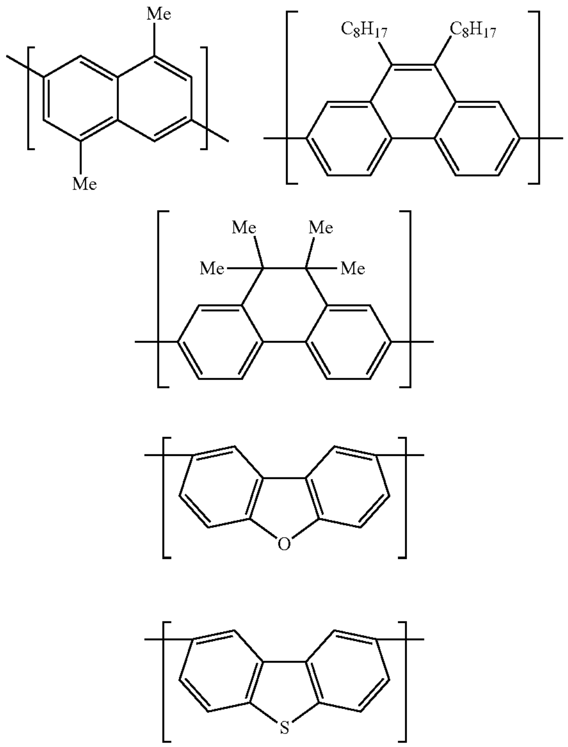

[Chemical Formula 10]

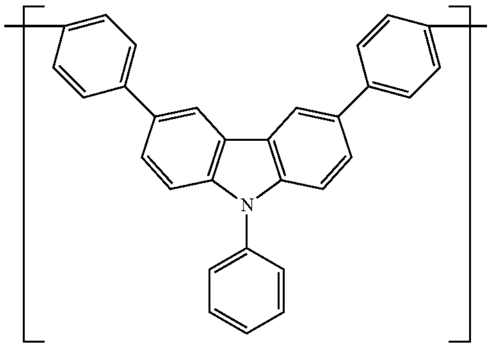

-continued

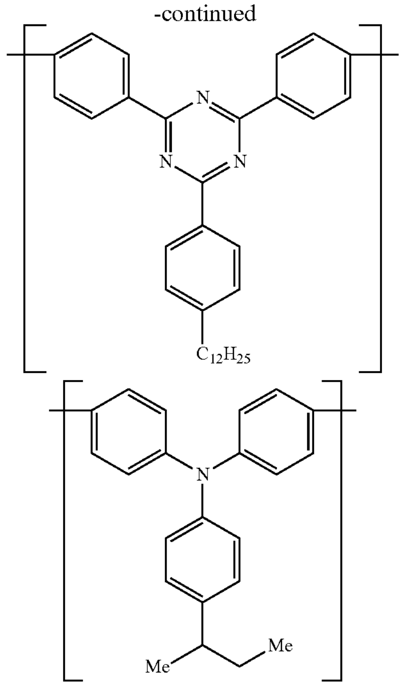

[Guest Material]

The guest material is a compound having a condensed heterocyclic group (hereinafter also referred to as "heterocyclic group G"), including a boron atom and at least one selected from the group consisting of an oxygen atom, a sulfur atom, a selenium atom, an $sp^3$ carbon atom, and a nitrogen atom in a ring. Here, it is preferable that the nitrogen atom which the heterocyclic group G may include be a nitrogen atom having no double bond.

The number of carbon atoms in the heterocyclic group G is usually 1 to 60, preferably 5 to 40, more preferably 10 to 25, without including the number of carbon atoms in a substituent. The number of hetero atoms in the heterocyclic group G is usually 1 to 30, preferably 1 to 10, more preferably 1 to 5, still more preferably 1 to 3, without including the number of carbon atoms in a substituent. The number of boron atoms in the heterocyclic group G is usually 1 to 10, preferably 1 to 5, more preferably 1 to 3, still more preferably 1, without including the number of carbon atoms in a substituent. The total number of oxygen atoms, sulfur atoms, selenium atoms, $sp^3$ carbon atoms, and nitrogen atoms in the heterocyclic group G is usually 1 to 10, preferably 1 to 5, more preferably 1 to 3, still more preferably 2, without including the number of carbon atoms in a substituent.

For achievement of more excellent luminance life of the light-emitting element in the present embodiment, the heterocyclic group G is preferably a condensed heterocyclic group containing a boron atom and at least one selected from the group consisting of an oxygen atom, a sulfur atom and a nitrogen atom in a ring, more preferably a condensed heterocyclic group containing a boron atom and a nitrogen atom in a ring.

For achievement of more excellent luminance life of the light-emitting element in the present embodiment, the heterocyclic group G is preferably a group having one or more hydrogen atoms directly bonding to atoms to compose a ring removed from a polycyclic heterocyclic compound containing a boron atom and at least one selected from the group consisting of an oxygen atom, a sulfur atom, a selenium atom, an $sp^3$ carbon atom, and a nitrogen atom; and the group may have a substituent. The polycyclic heterocyclic compound has preferably 3 to 12 rings, more preferably 3 to 6 rings, still more preferably 5 rings.

As the substituents which the heterocyclic group G may have, a halogen atom, an alkyl group, a cycloalkyl group, an alkoxy group, a cycloalkoxy group, an aryl group, a monovalent heterocyclic group or a substituted amino group is preferred; an alkyl group, a cycloalkyl group, an aryl group, a monovalent heterocyclic group or a substituted amino group is more preferred, and an alkyl group, and an aryl group or a substituted amino group is still more preferred; and these groups may further have a substituent.

The aryl group in the substituents which the heterocyclic group G may have is preferably a group having one hydrogen atom directly bonding to a carbon atom to compose a ring removed from a monocyclic or polycyclic (in particular, two-ring to 6-ring) aromatic hydrocarbon; more preferably a group having one hydrogen atom directly bonding to an atom to compose a ring removed from benzene, naphthalene, anthracene, phenanthrene, fluorene, spirobifluorene or pyrene; and more preferably a phenyl group; and these groups may have a substituent.

The monovalent heterocyclic group in the substituents which the heterocyclic group G may have is preferably a group having one hydrogen atom directly bonding to an atom to compose a ring removed from a monocyclic or polycyclic (in particular, 2-ring or 3-ring) heterocyclic compound, more preferably a group having one hydrogen atom directly bonding to an atom to compose a ring removed from pyridine, diazabenzene, triazine, azanaphthalene, diazanaphthalene, carbazole, azacarbazole, dibenzofuran, dibenzothiophene, phenoxazine or phenothiazine, more preferably a group having one hydrogen atom directly bonding to an atom to compose a ring removed from a pyridine, diazabenzene or triazine; and these groups may have a substituent.

In the substituted amino group in the substituents which the heterocyclic group G may have, the substituent which the amino group has is preferably an aryl group or a monovalent heterocyclic group, more preferably an aryl group; and these groups may further have a substituent. Examples and preferred ranges of the aryl group and the monovalent heterocyclic group in the substituents which the amino group has are the same as the examples and the preferred ranges of the aryl group and the monovalent heterocyclic group in the substituents which the heterocyclic group G may have, respectively.

As a substituent which the substituent which the heterocyclic group G may have may further have, a halogen atom, an alkyl group, a cycloalkyl group, an alkoxy group, a cycloalkoxy group, an aryl group, a monovalent heterocyclic group or a substituted amino group is preferred; an alkyl group, a cycloalkyl group, an aryl group, a monovalent heterocyclic group or a substituted amino group is more preferred; an alkyl group or a cycloalkyl group is still more preferred; and these groups may further have a substituent, though having no further substituent is preferred.

Examples and preferred ranges of the aryl group, the monovalent heterocyclic group and the substituted amino group in the substituents which the substituent the heterocyclic group G may have may further have are the same as the examples and the preferred ranges of the aryl group, the monovalent heterocyclic group and the substituted amino group in the substituents which the heterocyclic group G may have, respectively.

A term "nitrogen atom having no double bond" refers to a nitrogen atom having only a single bond between the nitrogen atom and any of the atoms bonding to the nitrogen atom.

A term "containing a nitrogen atom having no double bond in a ring" refers to containing —N(—$R^N$)—, wherein $R^N$ represents a hydrogen atom or a substituent, or containing a group represented by the following formula:

[Chemical Formula 11]

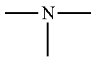

The molecular weight of the guest material is usually $1\times10^2$ to $1\times10^4$, preferably $2\times10^2$ to $5\times10^3$, more preferably $3\times10^2$ to $3\times10^3$, still more preferably $4\times10^2$ to $1.5\times10^3$.

It is preferable that the guest material have a compound having no molecular weight distribution.

For achievement of more excellent luminance life of the light-emitting element in the present embodiment, the guest material is preferably a compound represented by formula (1-1) to formula (1-3), more preferably a compound represented by formula (1-2) or formula (1-3), still more preferably a compound represented by formula (1-2).

[Chemical Formula 12]

(1-1)

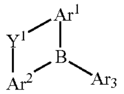

(1-2)

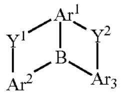

(1-3)

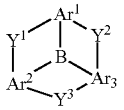

wherein $Ar^1$, $Ar^2$ and $Ar^3$ each independently represent an aromatic hydrocarbon group or a heterocyclic group, and these groups may have a substituent;

$Y^1$ represents an oxygen atom, a sulfur atom, a selenium atom, a group represented by —N(Ry)—, alkylene group or a cycloalkylene group, and these groups may have a substituent;

$Y^2$ and $Y^3$ each independently represent a single bond, an oxygen atom, a sulfur atom, a selenium atom, a group represented by —N(Ry)—, an alkylene group or a cycloalkylene group, and these groups may have a substituent; Ry represents a hydrogen atom, an alkyl group, a cycloalkyl group, an aryl group or a monovalent heterocyclic group, and these groups may have a substituent; In the case where a plurality of Ry's are present, they may be the same or different from each other; Ry may be bonded directly to or through a linking group to $Ar^1$, $Ar^2$ or $Ar^3$.

For achievement of more excellent luminance life of the light-emitting element in the present embodiment, $Ar^1$, $Ar^2$ and $Ar^3$ are groups having one or more hydrogen atoms directly bonding to a ring removed from a monocyclic, bicyclic or tricyclic aromatic hydrocarbon, or from a monocyclic, bicyclic or tricyclic aromatic heterocyclic compound; more preferably groups having one or more hydrogen atoms directly bonding to atoms to compose a ring removed from a monocyclic aromatic hydrocarbon or a monocyclic aromatic heterocyclic compound; still more preferably groups having one or more hydrogen atoms directly bonding to atoms to compose a ring removed from benzene, pyridine or diazabenzene; particularly preferably groups having one or more hydrogen atoms directly bonding to atoms to compose a ring removed from benzene; and these groups may have a substituent.

Examples and preferred ranges of the substituent which $Ar^1$, $Ar^2$ and $Ar^3$ may have are the same as the examples and the preferred ranges of the substituents which the heterocyclic group G may have, respectively.

$Y^1$ is preferably an oxygen atom, a sulfur atom, a group represented by —N(Ry)—, or a methylene group, more preferably an oxygen atom, a sulfur atom, or a group represented by —N(Ry)—, still more preferably a group represented by —N(Ry)—, and these groups may have a substituent.

$Y^2$ and $Y^3$ are preferably a single bond, an oxygen atom, a sulfur atom, a group represented by —N(Ry)—, or a methylene group, more preferably a single bond, an oxygen atom, a sulfur atom, or a group represented by —N(Ry)—, still more preferably an oxygen atom, a sulfur atom or a group represented by —N(Ry)—, particularly preferably a group represented by —N(Ry)—, and these groups may have a substituent.

Examples and preferred ranges of the substituent which $Y^1$, $Y^2$ and $Y^3$ may have are the same as the examples and the preferred ranges of the substituents which the heterocyclic group G may have, respectively.

Ry is preferably an alkyl group, a cycloalkyl group, an aryl group or a monovalent heterocyclic group, more preferably an aryl group or a monovalent heterocyclic group, still more preferably an aryl group, and these groups may have a substituent.

In Ry, examples and preferred ranges of the aryl group and the monovalent heterocyclic group are the same as the examples and the preferred ranges of the aryl group and the monovalent heterocyclic group in the substituents which the heterocyclic group G may have, respectively.

Examples and preferred ranges of the substituent which Ry may have are the same as the examples and the preferred ranges of the substituents which the heterocyclic group G may have, respectively.

Ry may bond directly to or through a linking group to $Ar^1$, $Ar^2$ and $Ar^3$, though not bonding thereto is preferred. Examples of the linking group include a group represented by —O—, a group represented by —S—, a group represented by —N(Ry)—, an alkylene group, a cycloalkylene group, a arylene group, and a divalent heterocyclic group, preferably a group represented by —O—, a group represented by —S—, a group represented by —N(Ry)—, or a methylene group, and these groups may have a substituent.

Examples of the guest material include compounds represented by the following formulas and compounds G1 to G7 to be described below.

[Chemical Formula 13]

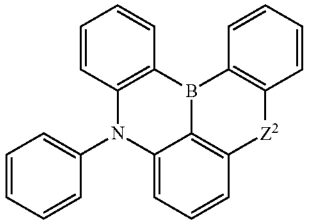

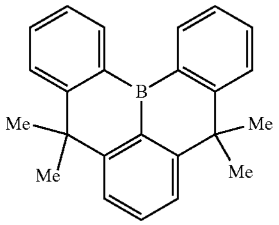

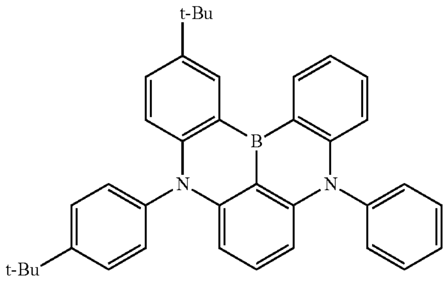

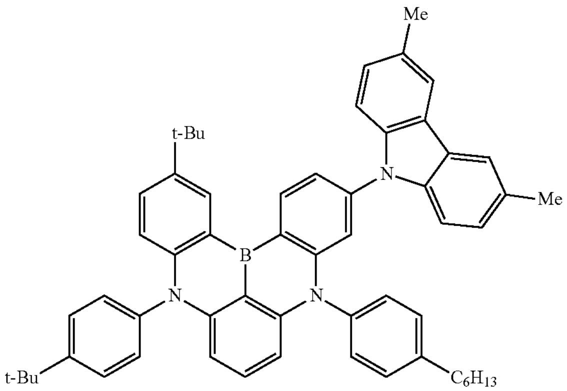

[Chemical Formula 14]

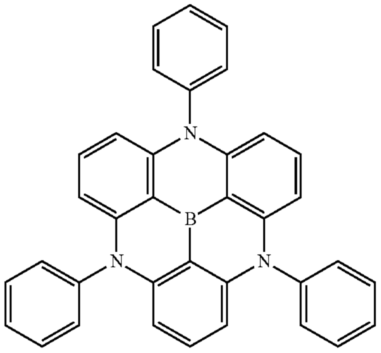

-continued

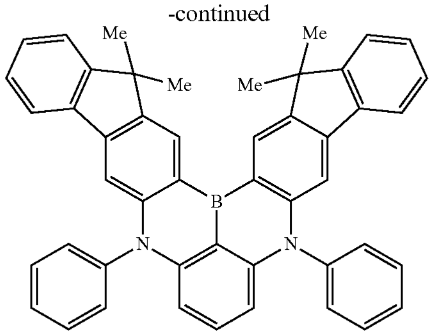

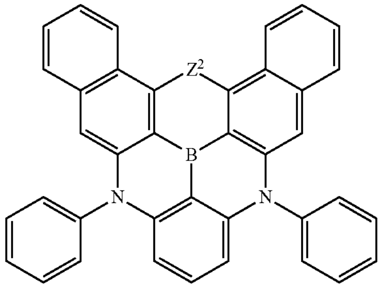

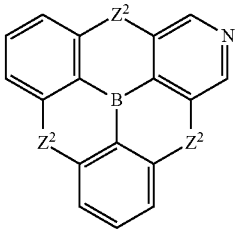

wherein $Z^2$ represents the same meaning as described above.

[Other Components]

The composition for a light-emitting element in the present embodiment is a composition contains a host material, a guest material, and at least one material selected from the group consisting of a hole transport material, a hole injection material, an electron transport material, an electron injection material, a light-emitting material, an antioxidant and a solvent. Note that the hole transport material, the hole injection material, the electron transport material, and the electron injection material are different from the host material, and the light-emitting material is different from the guest material.

[Ink]

A composition containing a host material, a guest material, and a solvent (hereinafter referred to as "ink") is suitable for producing a light-emitting element by a wet method such as spin coating, casting, micro gravure coating, gravure coating, bar coating, roll coating, wire bar coating, dip coating, spray coating, screen printing, flexography, offset printing, inkjet printing, capillary coating, and nozzle coating. The viscosity of the ink may be adjusted according to the type of printing method, being preferably 1 to 20 mPa·s at 25° C.

The solvent contained in the ink is preferably a solvent capable of dissolving or uniformly dispersing a solid content in the ink. Examples of the solvent include a chlorine-based solvent, an ether-based solvent, an aromatic hydrocarbon-based solvent, an aliphatic hydrocarbon-based solvent, a ketone-based solvent, an ester-based solvent, a polyhydric alcohol-based solvent, an alcohol-based solvent, a sulfoxide-based solvent, and an amide-based solvent.

In the ink, the amount of solvent blended is usually 1000 to 100000 parts by mass relative to the total 100 parts by mass of the host material and the guest material.

The solvent may be used alone or in combination of two or more.

Hole Transport Material

The hole transport material is classified into a low-molecular weight compound and a polymer compound, being preferably a polymer compound having a cross-linkable group.

Examples of the polymer compound include polyvinylcarbazole and derivatives thereof polyarylene having an aromatic amine structure in a side chain or a main chain and derivatives thereof. The polymer compound may be a compound with an electron-accepting moiety bonded thereto such as fullerene, tetrafluorotetracyanoquinodimethane, tetracyanoethylene, and trinitrofluorenone.

In the case where a hole transport material is contained in the composition for a light-emitting element in the present embodiment, the amount of the hole transport material blended is usually 1 to 400 parts by mass relative to the total 100 parts by mass of the host material and the guest material.

The hole transport material may be used alone or in combination of two or more.

Electron Transport Material

The electron transport material is classified into a low-molecular weight compound and a polymer compound. The electron transport material may have a cross-linkable group.

Examples of the low-molecular weight compound include a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone, and derivatives thereof.

Examples of the polymer compound include polyphenylene, polyfluorene, and derivatives thereof. The polymer compound may be doped with a metal.

In the case where an electron transport material is contained in the composition for a light-emitting element in the present embodiment, the amount of the electron-transport material blended is usually 1 to 400 parts by mass relative to the total 100 parts by mass of the host material and the guest material.

The electron transport material may be used alone or in combination of two or more.

Hole Injection Material and Electron Injection Material

The hole injection material and the electron injection material each are classified into a low-molecular weight compound and a polymer compound. The hole injection material and the electron injection material may have a cross-linkable group.

Examples of the low-molecular weight compound include a metal phthalocyanine such as copper phthalocyanine; carbon; an oxide of metals such as molybdenum and tungsten; and a metal fluoride such as lithium fluoride, sodium fluoride, cesium fluoride, and potassium fluoride.

Examples of the polymer compound include conductive polymers such as polyaniline, polythiophene, polypyrrole, polyphenylenevinylene, polythienylenevinylene, polyquinoline and polyquinoxaline, and derivatives thereof; polymers containing an aromatic amine structure in the main chain or the side chain.

In the case where the hole injection material and/or the electron injection material are contained in the composition for light-emitting elements in the present embodiment, the amount of each of the hole injection material and the electron injection material is usually 1 to 400 parts by mass relative to the total 100 parts by mass of the host material and the guest material.

Each of the hole injection material and the electron injection material may be used alone or in combination of two or more.

Ion Doping

In the case where the hole injection material or the electron injection material contains a conductive polymer, the electric conductivity of the conductive polymer is preferably $1\times10^{-5}$ S/cm to $1\times10^{3}$ S/cm. In order to control the electric conductivity of the conductive polymer to such a range, an appropriate amount of ions may be doped into the conductive polymer. The type of ion for doping is an anion for a hole injection material, and a cation for an electron injection material. Examples of the anion include a polystyrenesulfonic acid ion, an alkylbenzene sulfonic acid ion, and a camphor sulfonic acid. Examples of the cation include a lithium ion, a sodium ion, a potassium ion, and a tetrabutylaminonium ion.

The ions for doping may be used alone or in combination of two or more.

Light-Emitting Material

The light-emitting material is classified into a low-molecular weight compound and a polymer compound. The light-emitting material may have a cross-linkable group.

Examples of the low-molecular weight compound include naphthalene and derivatives thereof, anthracene and derivatives thereof, perylene and derivatives thereof, and a triplet light-emitting complex having iridium, platinum or europium as a center metal.

Examples of the polymer compound include an arylene group such as a phenylene group, a naphthalenediyl group, a fluorenediyl group, a phenanthrenediyl group, a dihydrophenanthrenediyl group, an anthracenediyl group, and a pyrenediyl group; an aromatic amine residue such as a group having two hydrogen atoms removed from an aromatic amine; and a polymer compound containing a divalent heterocyclic group such as a carbazolediyl group, a phenoxazinediyl group and a phenothiazinediyl group.

In the case where a light-emitting material is contained in the composition for a light-emitting element in the present embodiment, the content of the light-emitting material is usually 0.1 to 400 parts by mass relative to the total 100 parts by mass of the host material and the guest material.

The light-emitting material may be used alone or in combination of two or more.

Antioxidant

The antioxidant may be a compound soluble in the same solvent as those of the host material and the guest material, not impairing light emission and charge transfer, and examples thereof include a phenol-based antioxidant and a phosphoric acid-based antioxidant.

In the case where an antioxidant is contained in the composition for a light-emitting element in the present embodiment, the amount of the antioxidant blended is usually 0.001 to 10 parts by mass, relative to the total 100 parts by mass of the host material and the guest material.

The antioxidant may be used alone or in combination of two or more.

<Film>

A film contains the composition for a light-emitting element in the present embodiment, being suitable for a light emitting layer in the light-emitting element. The film may be produced from an ink by a wet method, having a thickness of usually 1 nm to 10 μm.

<Light-Emitting Element>

The light-emitting element in the present embodiment contains the composition for a light-emitting element described above.

The structure of the light-emitting element in the present embodiment comprises, for example, electrodes including an anode and a cathode, and a layer containing the composition for a light-emitting element in the present embodiment disposed between the electrodes.

[Layer Structure]

The layer containing the composition for a light-emitting element in the present embodiment includes usually one or more layers selected from the group consisting of an emitting layer, a hole transport layer, a hole injection layer, an electron transport layer and an electron injection layer, preferably a light-emitting layer. These layers each contain a light-emitting material, a hole transport material, a hole injection material, an electron transport material, and an electron injection material, respectively. These layers each can be formed by the same method as that for making the film described above, in which the light-emitting material, the hole transport material, the hole injection material, the electron transport material and the electron injection material each are dissolved in the solvent described above to prepare an ink for use.

A light-emitting element has a light-emitting layer between an anode and a cathode. It is preferable for the light-emitting element in the present embodiment to have at least one layer of the hole injection layer and the hole transport layer between the anode and the light emitting layer from the viewpoint of properties of hole injection and hole transport, and to have at least one layer of the electron injection layer and the electron transport layer between the cathode and the light-emitting layer from the viewpoint of properties of electron injection and electron transport.

Examples of the material for the hole transport layer, the electron transport layer, the light emitting layer, the hole injection layer and the electron injection layer include the hole transport material, the electron transport material, the light-emitting material, the hole injection material and the electron injection material described above, respectively, other than the composition for a light-emitting element in the present embodiment.

In the case where the material for the hole transport layer, the material for the electron transport layer and the material for the light-emitting layer are dissolved in solvents for use in forming the layers adjacent to the hole transport layer, the electron transport layer and the light-emitting layer, respectively, it is preferable that the materials have a cross-linkable group in order to prevent the materials from being dissolved in the solvents. After formation of each of the layers from the material having a cross-linkable group, the cross-linkable group is cross-linked, so that the layers can be insolubilized.

Examples of the method for forming each of the light-emitting layer, the hole transport layer, the electron transport layer, the hole injection layer, the electron injection layer, etc., include: in the case of using a low-molecular weight compound, a dry method such as vacuum deposition from powder and a wet method such as deposition from a solution or a melted state; and in the case of using a polymer compound, a wet method such as deposition from a solution or a melted state. The sequence, the number, and the thickness of the layers to be laminated are adjusted considering, for example, the emission efficiency and the luminance life.

[Substrate/Electrode]

The substrate in the light-emitting element may be a substrate on which an electrode can be formed, causing no chemical change in formation of an organic layer, and examples thereof include a substrate made of material such as glass, plastic and silicon. In the case of an opaque substrate, it is preferable that the electrode furthest from the substrate be transparent or translucent.

Examples of the anode material include a conductive metal oxide and a translucent metal, preferably indium oxide, zinc oxide, tin oxide; a conductive compound such as indium tin oxide (ITO) and indium zinc oxide; a complex of silver, palladium and copper (APC); NESA, gold, platinum, silver, and copper.

Examples of the material for the cathode includes a metal such as lithium, sodium, potassium, rubidium, cesium, beryllium, magnesium, calcium, strontium, barium, aluminum, zinc, and indium; an alloy of two or more thereof; an alloy of one or more thereof and one or more of silver, copper, manganese, titanium, cobalt, nickel, tungsten and tin; and graphite and a graphite intercalation compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The anode and the cathode each may have a laminated structure having two or more layers.

[Application]

In order to obtain planar light emission from a light-emitting element, a planar anode and a planar cathode may be disposed so as to overlap to each other. In order to obtain a patterned light-emission, a method for installing a mask having a patterned window on the surface of a planar light-emitting element, a method for forming an extremely thick layer, which is substantially non-light emitting, to make a non-light-emitting part, and a method for forming an anode, a cathode, or both electrodes in a patterned shape may be employed. A pattern is formed by any of these methods, and some of the electrodes are arranged to be independently turned on/off, so that a segment-type display device capable of displaying numbers, characters, etc. can be obtained. In order to make a dot-matrix display device, both of an anode and a cathode may be formed into a stripe shape to be arranged orthogonal to each other. A method for applying different polymer compounds having a plurality types of luminescent colors and a method for using a color filter or a fluorescent conversion filter enable partial color display and multi-color display. The dot matrix display device may be passively driven or actively driven in combination with a TFT or the like. These display devices may be used for displays of computers, televisions, mobile terminals, etc. The planar light-emitting element may be suitably used as a planar light source for backlight of a liquid crystal display device or as a planar light source of illumination. Use of a flexible substrate enables use as a light source or a display device having a curved surface.

Although the preferred embodiments of the present invention have been described above, the present invention is not limited thereto.

For example, an aspect of the present invention relates to a method for producing a composition for a light-emitting element. The production method may comprise a preparation step of preparing a host material, a selection step of selecting a gust material having the difference ΔS equal to or less than 0.10 eV and the difference ΔE equal to or less than 0.50 eV or less, and a production step of mixing the host material and the guest material to obtain a composition for a light-emitting element.

The production method described above may further comprise a step of obtaining the energy value at the maximum peak of the emission spectrum of the host material at 25° C.

In the production method described above, the selection step may comprise obtaining each of the energy value at the peak on the lowest energy side of the absorption spectrum of the guest material compound at 25° C., the energy value at the maximum peak of the emission spectrum at 25° C., and the energy value at the maximum peak of the emission spectrum at 77 K, so as to calculate the difference ΔE and the difference ΔS.

One aspect of the present invention relates to a method for producing light-emitting elements. The production method may be a method for producing a light-emitting element having an anode, a cathode, and a layer disposed between the anode and the cathode, comprising a step of producing a composition for a light-emitting element by the production method described above, and a step of forming the layer by a dry method or a wet method from the composition produced by the step.

One aspect of the present invention relates to a method for evaluating a composition for a light-emitting element containing a host material and a guest material. The evaluation method may comprise a step of obtaining the difference ΔE, a step of obtaining the difference ΔS, and a step of evaluating the composition for a light-emitting element based on the difference ΔE and the difference ΔS.

EXAMPLES

The present invention is more specifically described with reference to Examples as follows, though the present invention is not limited to the following Examples.

In Examples, the maximum peak wavelength of each of the emission spectra of compounds H1 to H4 at room temperature was measured at room temperature by a spectrophotometer (FP-6500, manufactured by JASCO Corporation). A xylene solution in which a compound was dissolved in xylene at a concentration of about $8\times10^{-4}$ mass % was used as a sample. Ultraviolet (UV) light having a wavelength of 325 nm was used as the excitation light.

In Examples, the peak wavelength on the lowest energy side of the absorption spectrum of each of compounds G1 to G7 at room temperature was measured at room temperature by an ultraviolet-visible spectrophotometer (Cary 5E, manufactured by Varian, Inc.). A xylene solution in which a compound was dissolved in xylene at a concentration of about $8\times10^{-4}$ mass % was used as a sample.

In Examples, the maximum peak wavelength of the emission spectrum of each of the compounds G1 to G7 at room temperature was measured at room temperature by a multichannel spectrometer (PMA-12, manufactured by Hamamatsu Photonics K.K.). A 2-methyltetrahydrofuran solution in which a compound is dissolved in 2-methyltetrahydrofuran at a concentration of about $8\times10^{-4}$ mass % was used as a sample. As the excitation light, a He—Cd laser having a wavelength of 325 nm (manufactured by Kimmon Koha Co., Ltd.) was used.

In Examples, the maximum peak wavelength of the emission spectrum of each of the compounds G1 to G7 at 77 K was measured at 77 K by a multichannel spectrometer (PMA-12, manufactured by Hamamatsu Photonics K.K.). A 2-methyltetrahydrofuran solution in which a compound is dissolved in 2-methyltetrahydrofuran at a concentration of about $8\times10^{-4}$ mass % was used as a sample. As the excitation light, a He—Cd laser having a wavelength of 325 nm manufactured by Kimmon Koha Co., Ltd.) was used.

In Examples, the number average molecular weight (Mn) of a polymer compound in terms of polystyrene and the weight average molecular weight (Mw) in terms of polystyrene were determined by size exclusion chromatography (SEC) using tetrahydrofuran as a mobile phase.

Specifically, a polymer compound to be measured was dissolved in tetrahydrofuran at a concentration of about 0.05 mass %, and 10 μL thereof was injected into SEC. The mobile phase was flown at a flow rate of 1.0 mL/minute. As a column, PLgel MIXED-B (manufactured by Polymer Laboratories) was used. As the detector, a UV-VIS detector (trade name: UV-8320 GPC, manufactured by Tosoh Corporation) was used.

<Acquisition and Synthesis of Compounds H1 to H4 and G1 to G7>

The compounds H1 to H4 and G1 to G7 used in Examples were as follows.

The compound H1 for use was manufactured by Luminescence Technology Corp. The maximum peak wavelength of the emission spectrum of the compound H1 at room temperature was 373 nm, and the energy value thereof was 3.324 eV.

The compound H2 was synthesized according to a method described in International Publication No. WO 2011/098030. The maximum peak wavelength of the emission spectrum of the compound H2 at room temperature was 431 nm, and the energy value thereof was 2.877 eV.

The compound H3 was synthesized according to a method described in international Publication No. WO 2017/038613. The maximum peak wavelength of the emission spectrum of the compound H3 at room temperature was 369 nm, and the energy value thereof was 3.360 eV.

The compound H4 was synthesized according to a method described in international Publication No. WO 2008/059713. The maximum peak wavelength of the emission spectrum of the compound H4 at room temperature was 441 nm, and the energy value thereof was 2.812 eV.

The compound G1 was synthesized according to a method described in International Publication No. WO 2015/102118. The peak wavelength of the absorption spectrum on the lowest energy side of the compound G1 at room temperature was 441 nm, and the energy value thereof was 2.812 eV. The energy value of the full width at half maximum of the peak on the lowest energy side of the absorption spectrum of the compound G1 at room temperature was 0.142 eV. The maximum peak wavelength of the emission spectrum of compound G1 at room temperature was 453.2 nm, and the energy value thereof was 2.736 eV. The maximum peak wavelength of the emission spectrum of the compound G1 at 77 K was 448.7 nm, and the energy value thereof was 2.764 eV.

The compound G2 for use was manufactured by Luminescence Technology Corp. The peak wavelength of the absorption spectrum on the lowest energy side of the compound G2 at room temperature was 439 nm, and the energy value thereof was 2.825 eV. The energy value of the full width at half maximum of the peak on the lowest energy side of the absorption spectrum of the compound G2 at room temperature was 0.171 eV. The maximum peak wavelength of the emission spectrum of compound G2 at room temperature was 451.7 nm, and the energy value thereof was 2.745 eV. The maximum peak wavelength of the emission spectrum of the compound G2 at 77 K was 450.2 nm, and the energy value thereof was 2.754 eV.

The compound G3 was synthesized according to a method described in International Publication No. WO 2015/102118. The peak wavelength of the absorption spectrum on the lowest energy side of the compound G3 at room temperature was 433 nm, and the energy value thereof was 2.864 eV. The energy value of the full width at half maximum of the peak on the lowest energy side of the absorption spectrum of the compound G3 at room temperature was 0.147 eV. The maximum peak wavelength of the emission spectrum of compound G3 at room temperature was 444.9 nm, and the energy value thereof was 2.787 eV. The maximum peak wavelength of the emission spectrum of the compound G3 at 77 K was 438.2 nm, and the energy value thereof was 2.830 eV.

The compound G4 was synthesized according to a method described in International Publication No. WO 2015/102118. The peak wavelength of the absorption spectrum on the lowest energy side of the compound G4 at room temperature was 427 nm, and the energy value thereof was 2.904 eV. The energy value of the full width at half maximum of the peak on the lowest energy side of the absorption spectrum of the compound G4 at room temperature was 0.159 eV. The maximum peak wavelength of the emission spectrum of compound G4 at room temperature was 438.9 nm, and the energy value thereof was 2.825 eV. The maximum peak wavelength of the emission spectrum of the compound G4 at 77 K as 438.9 nm, and the energy value thereof was 2.825 eV.

The compound G5 was synthesized according to a method described in International Publication No. WO 2015/102118. The peak wavelength of the absorption spectrum on the lowest energy side of the compound G5 at room temperature was 450 nm, and the energy value thereof was 2.756 eV. The energy value of the full width at half maximum of the peak on the lowest energy side of the absorption spectrum of the compound G5 at room temperature was 0.161 eV. The maximum peak wavelength of the emission spectrum of compound G5 at room temperature was 463.7 nm, and the energy value thereof was 2.674 eV. The maximum peak wavelength of the emission spectrum of the compound G5 at 77 K was 458.4 nm, and the energy value thereof was 2.705 eV.

The compound G6 was synthesized according to a method described in International Publication No. WO 2015/102118. The peak wavelength of the absorption spectrum on the lowest energy side of the compound G6 at room temperature was 438 nm, and the energy value thereof was 2.831 eV. The energy value of the full width at half maximum of the peak on the lowest energy side of the absorption spectrum of the compound G6 at room temperature was 0.144 eV. The maximum peak wavelength of the emission spectrum of compound G6 at room temperature was 452.4 nm, and the energy value thereof was 2341 eV. The maximum peak wavelength of the emission spectrum of the compound G6 at 77 K was 446.4 nm, and the energy value thereof was 2.778 eV.

The compound G7 was synthesized according to a method described in International Publication No. WO 2015/102118. The peak wavelength of the absorption spectrum on the lowest energy side of the compound G7 at room temperature was 430 nm, and the energy value thereof was 2.884 eV. The energy value of the full width at half maximum of the peak on the lowest energy side of the absorption spectrum of the compound G7 at room temperature was 0.149 eV. The maximum peak wavelength of the emission spectrum of compound G7 at room temperature was 442.7 nm, and the energy value thereof was 7.801 eV. The maximum peak wavelength of the emission spectrum of the compound G7 at 77 K was 441.9 nm, and the energy value thereof was 2.806 eV.

[Chemical Formula 15]

Compound H1

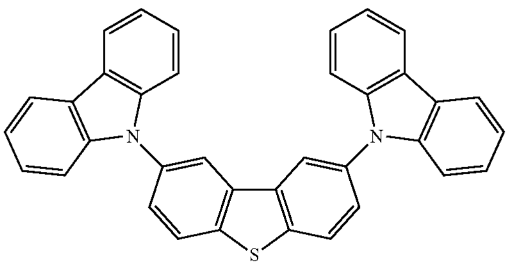

Compound H2

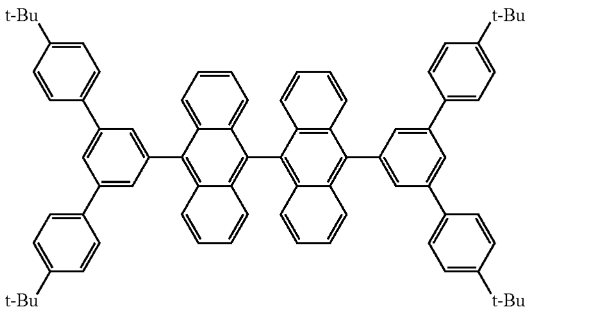

-continued
[Chemical Formula 16]
Compound H3
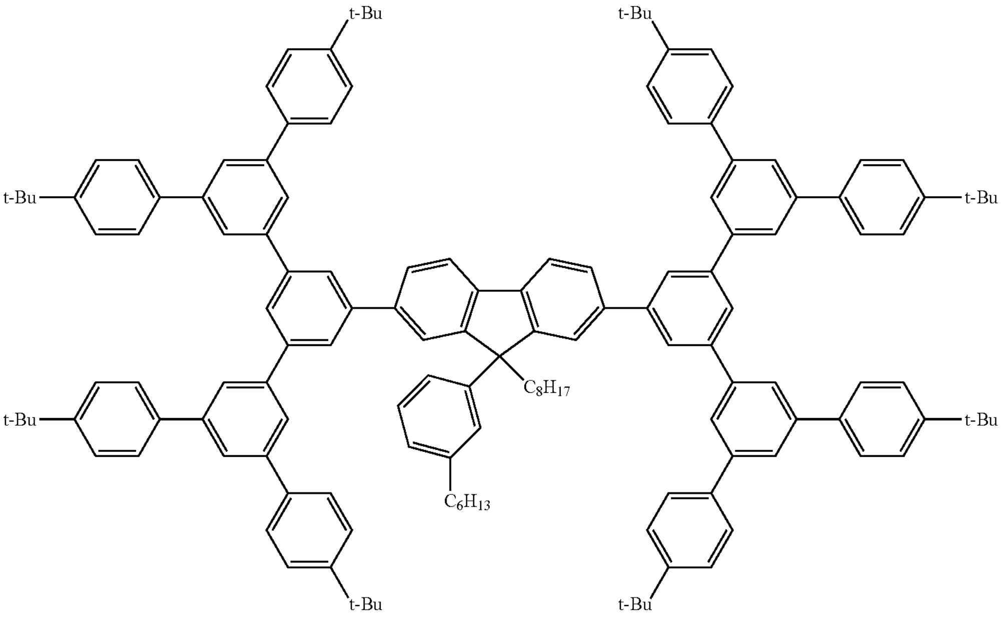
Compound H4
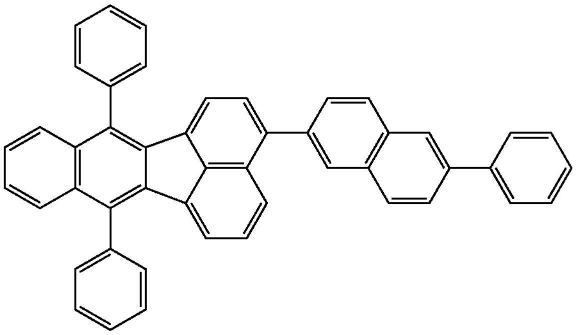
[Chemical Formula 17]
Compound G1
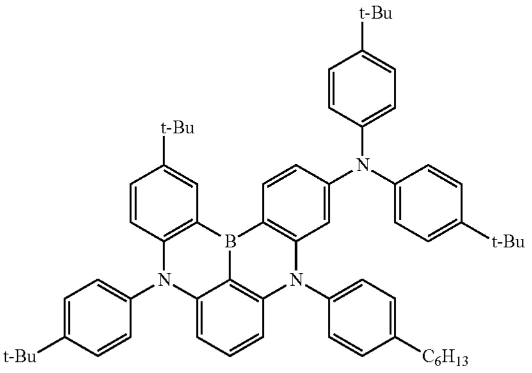
Compound G2
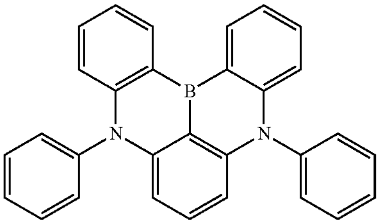

-continued
Compound G3
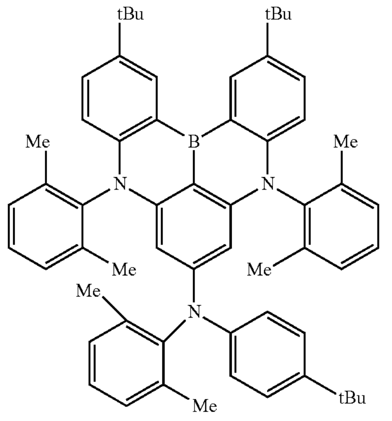
[Chemical Formula 18]
Compound G4
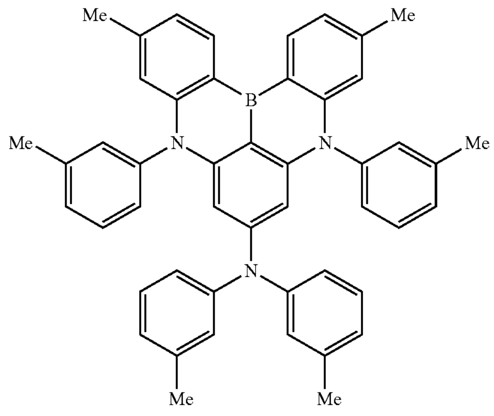
Compound G5
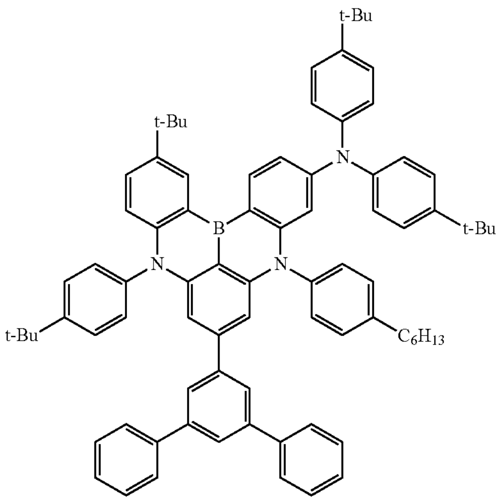
Compound G6
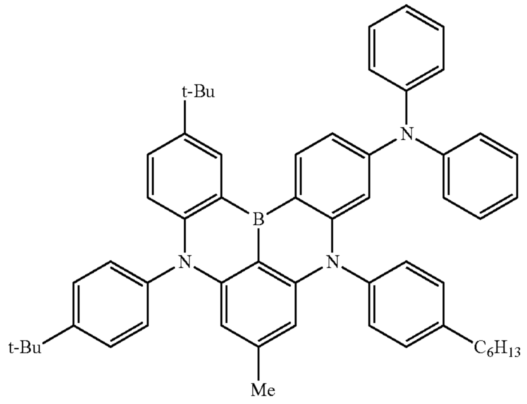

-continued

[Chemical Formula 19]

Compound G7

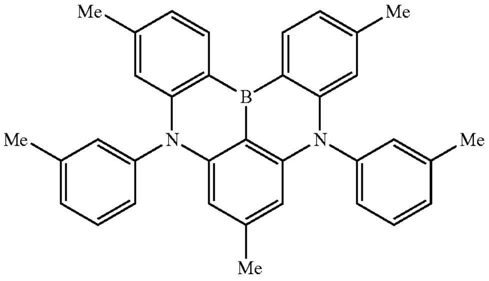

Synthesis Example HP1

Synthesis of Polymer Compound HP1

A polymer compound HP1 was synthesized from a compound M1 and a compound M2 according to a method described in Japanese Unexamined Patent Publication No. 2012-36381. The polymer compound HP1 had an Mn of $8.1\times10^4$ and an Mw of $3.4\times10^5$.

[Chemical Formula 20]

Compound M1

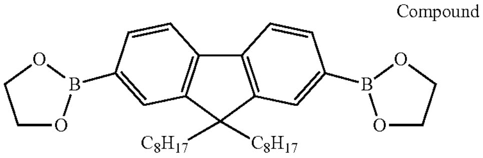

Compound M2

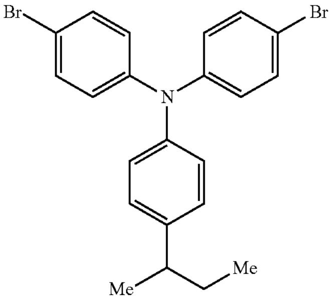

The polymer compound HP1 is a copolymer comprising a structural unit derived from the compound M1 and a structural unit derived from the compound M2 at a molar ratio of 50:50 in theoretical values determined from the amount of the raw material charged.

The emission spectrum of the polymer compound HP1 at room temperature had a maximum peak wavelength of 429 nm, and the energy value thereof was 2.890 eV.

Synthesis Example HP2

Synthesis of Polymer Compound HP2

A polymer compound HP2 was synthesized from a compound M3 and a compound M4 according to a method described in Japanese Unexamined Patent Publication No. 2012-144722. The polymer compound HP2 had an Mn of $8.7\times10^4$ and an Mw of $2.4\times10^5$.

[Chemical Formula 21]

Compound M3

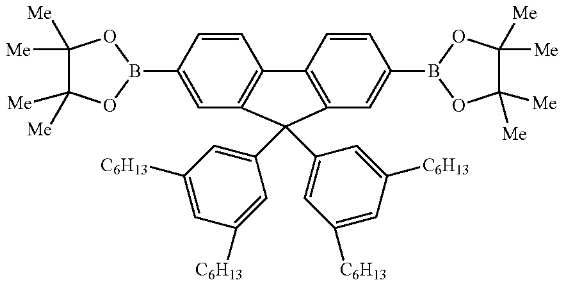

Compound M4

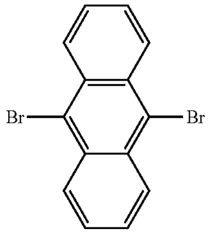

The polymer compound HP2 is a copolymer comprising a structural unit derived from the compound M3 and a structural unit derived from the compound M4 at a molar ratio of 50:50 in theoretical values determined from the amount of the raw material charged.

The emission spectrum of the polymer compound HP2 at room temperature had a maximum peak wavelength of 439 nm, and the energy value thereof was 2.825 eV.

Example D1

Making and Evaluation of Light-Emitting Element D1

(Formation of Anode and Hole Injection Layer)

An ITO film was deposited to a thickness of 45 nm on a glass substrate by sputtering, so that an anode was formed. On the anode, a hole injection material ND-3202 (manufactured by Nissan Chemical Corporation) was deposited to a thickness of 35 nm by spin coating. The substrate with the hole injection layer laminated thereon was heated at 50° C. for 3 minutes on a hot plate in an atmospheric atmosphere, and further heated at 230° C. for 15 minutes, so that a hole injection layer was formed.

(Formation of Hole Transport Layer)

A polymer compound HTL-1 was dissolved in xylene at a concentration of 0.7 mass %. A film was deposited from the resulting xylene solution to a thickness of 20 nm on the hole injection layer by spin coating and heated at 180° C. for 60 minutes on a hot plate in a nitrogen gas atmosphere, so that a hole transport layer was formed. The polymer compound HTL-1 is a polymer compound in Polymer Example 1 in International Publication No. WO 2014/102543.

(Formation of Light-Emitting Layer)

In toluene, the compound H1 and the compound G2 (compound H1/compound G2=99 mass %/1 mass %) were dissolved at a concentration of 1.5 mass %. From the resulting toluene solution, a film was deposited on the hole transport layer to a thickness of 60 nm by spin coating and heated at 130° C. for 10 minutes in a nitrogen gas atmosphere, so that a light-emitting layer was formed.

(Formation of Cathode)

After the substrate having the light-emitting layer was placed in a vapor deposition chamber and the pressure was reduced to $1.0\times10^{-4}$ Pa or less, sodium fluoride was vapor-deposited on the light-emitting layer to a thickness of about 4 nm, and then aluminum was vapor-deposited on the sodium fluoride layer to a thickness of about 80 nm as a cathode. After the vapor deposition, the substrate on which the cathode was formed was sealed with a glass substrate, so that a light-emitting element D1 was made.

(Evaluation of Light-Emitting Element)

A voltage was applied to the light-emitting element D1, so that an EL emission was observed. At 100 mA/cm$^2$, CIE chromaticity coordinates (x, y) were measured. In addition, under a constant current drive at 100 mA/cm$^2$, the time periods until the luminance reached 50% and 60% of the initial luminance were measured.

Examples D2 to D10, and Comparative Example CD1

Making and Evaluation of Light-Emitting Elements D2 to D10 and CD1

Light-emitting elements D2 to D10 and CD1 were made in the same manner as in Example D1, except that the materials described in Table 1 were used instead of "the compound H1 and the compound G2 (compound H1/compound G2=99 mass %/1 mass %)" in (Formation of light-emitting layer) in Example D1.

A voltage was applied to the light-emitting elements D2 to D10 and CD1, so that EL emission was observed. At 100 mA/cm$^2$, CIE chromaticity coordinates (x, y) were measured. In addition, under a constant current drive at 100 mA/cm$^2$, the time periods until the luminance reached 50% of the initial luminance were measured.

Results in Examples D1 to D10 and Comparative Example CD1 are shown in Table 1. When the time period until the luminance of the light-emitting element CD1 reached 50% of the initial luminance (luminance life) was taken as 1.0, the relative values of the time period until the luminance of the light-emitting elements D1 to D10 reached 50% of the initial luminance (luminance life) are shown.

TABLE 1

| | Light-emitting element | Light-emitting layer | | | | | | | | |
|---|---|---|---|---|---|---|---|---|---|---|
| | | Host material | Guest material | | | Compositional ratio (mass %) | EH-EG (eV) | Luminance life (relative value) | CIE chromaticity coordinates (x, y) |
| | | | Material | ΔS(eV) | ΔE(eV) | | | | |
| Example D1 | D1 | H1 | G2 | 0.009 | 0.500 | 99/1 | 0.500 | 1.2 | (0.14, 0.05) |
| Example D2 | D2 | H3 | G3 | 0.043 | 0.497 | 99/1 | 0.497 | 1.6 | (0.15, 0.03) |
| Example D3 | D3 | H3 | G7 | 0.005 | 0.477 | 99/1 | 0.477 | 1.5 | (0.15, 0.03) |
| Example D4 | D4 | H1 | G3 | 0.043 | 0.461 | 99/1 | 0.461 | 1.2 | (0.15, 0.04) |
| Example D5 | D5 | H3 | G4 | 0 | 0.456 | 99/1 | 0.456 | 1.5 | (0.16, 0.03) |
| Example D6 | D6 | H1 | G4 | 0 | 0.420 | 99/1 | 0.420 | 1.2 | (0.15, 0.03) |
| JExample D7 | D7 | H2 | G5 | 0.031 | 0.121 | 99/1 | 0.121 | 5.5 | (0.14, 0.10) |
| Example D8 | D8 | H2 | G1 | 0.027 | 0.065 | 99/1 | 0.065 | 7.7 | (0.15, 0.07) |
| Example D9 | D9 | H2 | G6 | 0.037 | 0.046 | 99/1 | 0.046 | 5.5 | (0.15, 0.08) |
| Example D10 | D10 | H2 | G3 | 0.043 | 0.013 | 99/1 | 0.013 | 3.9 | (0.16, 0.09) |
| Comparative Example CD1 | CD1 | H1 | G1 | 0.027 | 0.513 | 99/1 | 0.513 | 1.0 | (0.14, 0.05) |

Examples D11 to D14

Making and Evaluation of Light-Emitting Elements D11 to D14

Light-emitting elements D11 to D14 were made in the same manner as in Example D1, except that the materials described in Table 2 were used instead of "the compound H1 and the compound G2 (compound H1/compound G2=99 mass %/1 mass %)" in (Formation of light-emitting layer) in Example D1.

A voltage was applied to the light-emitting elements D11 to D14, so that EL emission was observed. At 100 mA/cm$^2$, CIE chromaticity coordinates (x, y) were measured. In addition, under a constant current drive at 100 mA/cm$^2$, the time periods until the luminance reached 60% of the initial luminance were measured.

Results in Examples D11 to D14 and Comparative Example CD1 are shown in Table 2. When the time period until the luminance of the light-emitting element CD1 reached 60% of the initial luminance (luminance life) was taken as 1.0, the relative values of the time period until the luminance of the light-emitting elements D11 to D14 reached 60% of the initial luminance (luminance life) are shown.

TABLE 2

| | Light-emitting element | Light-emitting layer | | | | | | | | |
|---|---|---|---|---|---|---|---|---|---|---|
| | | Host material | Guest material | | | Compositional ratio (mass %) | EH-EG (eV) | Luminance life (relative value) | CIE chromaticity coordinates (x, y) |
| | | | Material | ΔS(eV) | ΔE(eV) | | | | |
| Example D11 | D11 | HP1 | G6 | 0.037 | 0.059 | 99/1 | 0.059 | 1.4 | (0.15, 0.06) |
| Example D12 | D12 | HP1 | G2 | 0.009 | 0.066 | 99/1 | 0.066 | 1.7 | (0.15, 0.06) |
| Example D13 | D13 | HP1 | G4 | 0 | 0.079 | 99/1 | 0.079 | 2.1 | (0.15, 0.06) |
| Example D14 | D14 | HP1 | G5 | 0.031 | 0.135 | 99/1 | 0.135 | 2.7 | (0.14, 0.09) |
| Comparative Example CD1 | CD1 | H1 | G1 | 0.027 | 0.513 | 99/1 | 0.513 | 1.0 | (0.14, 0.05) |

Examples D15 to D20 and Comparative Examples CD2 to CD5

Making and Evaluation of Light-Emitting Elements D15 to D20 and CD2 to CD5

Light-emitting elements D15 to D20 and CD2 to CD5 were made in the same manner as in Example D1, except that the materials described in Table 3 were used instead of "the compound H1 and the compound G2 (compound H1/compound G2=99 mass %/1 mass %)" in (Formation of light-emitting layer) in Example D1.

A voltage was applied to the light-emitting elements D15 to D20 and CD2 to CD5, so that EL emission was observed. At 100 mA/cm$^2$, CIE chromaticity coordinates (x, y) were measured. In addition, under a constant current drive at 100 mA/cm$^2$, the time periods until the luminance reached 70% of the initial luminance were measured.

Results in Examples D15 to D20 and Comparative Examples CD2 to CD5 are shown in Table 3. When the time period until the luminance of the light-emitting element CD2 reached 70% of the initial luminance (luminance life) was taken as 1.0, the relative values of the time period until the luminance of the light-emitting elements D15 to D20 and CD3 to CD5 reached 70% of the initial luminance (luminance life) are shown.

TABLE 3

| | Light-emitting element | Light-emitting layer | | | | | | | | |
|---|---|---|---|---|---|---|---|---|---|---|
| | | Host material | Guest material | | | Compositional ratio (mass %) | EH-EG (eV) | Luminance life (relative value) | CIE chromaticity coordinates (x, y) |
| | | | Material | ΔS(eV) | ΔE(eV) | | | | |
| Example D15 | D15 | H4 | G2 | 0.009 | 0.013 | 99/1 | −0.013 | 179.1 | (0.16, 0.19) |
| Example D16 | D16 | HP2 | G2 | 0.009 | 0.000 | 99/1 | 0.000 | 12.5 | (0.15, 0.07) |
| Comparative Example CD2 | CD2 | H3 | G2 | 0.009 | 0.536 | 99/1 | 0.536 | 1.0 | (0.15, 0.06) |
| Example D17 | D17 | H4 | G6 | 0.037 | 0.019 | 99/1 | −0.019 | 185.7 | (0.17, 0.21) |
| Example D18 | D18 | HP2 | G6 | 0.037 | 0.006 | 99/1 | −0.006 | 12.6 | (0.15, 0.07) |
| Comparative Example CD3 | CD3 | H3 | G6 | 0.037 | 0.529 | 99/1 | 0.529 | 1.0 | (0.15, 0.04) |
| Example D19 | D19 | H4 | G5 | 0.031 | 0.056 | 99/1 | 0.056 | 192.3 | (0.17, 0.21) |
| Example D20 | D20 | HP2 | G5 | 0.031 | 0.069 | 99/1 | 0.069 | 28.7 | (0.15, 0.07) |
| Comparative Example CD4 | CD4 | H3 | G5 | 0.031 | 0.605 | 99/1 | 0.605 | 1.2 | (0.15, 0.04) |
| Comparative Example CD5 | CD5 | H1 | G5 | 0.031 | 0.569 | 99/1 | 0.569 | 0.9 | (0.13, 0.09) |

Examples D21 to D23

Making and Evaluation of Light-Emitting Elements D21 to D23

Light-emitting elements D21 to D23 were made in the same manner as in Example D1, except that the materials described in Table 4 were used instead of "the compound H1 and the compound G2 (compound H1/compound G2=99 mass %/1 mass %)" in (Formation of light-emitting layer) in Example D1.

A voltage was applied to the light-emitting elements D21 to D23, so that EL emission was observed. At 100 mA/cm$^2$, CIE chromaticity coordinates (x, y) were measured. In addition, under a constant current drive at 100 mA/cm$^2$, the time periods until the luminance reached 60% of the initial luminance were measured.

Results in Examples D21 to D23 are shown in Table 4. When the time period until the luminance of the light-emitting element D23 reached 60% of the initial luminance (luminance life) was taken as 1.0, the relative values of the time period until the luminance of the light-emitting elements D21 and D22 reached 60% of the initial luminance (luminance life) are shown.

TABLE 4

| | Light-emitting element | Light-emitting layer | | | | | | | |
|---|---|---|---|---|---|---|---|---|---|
| | | Host material | Guest material | | | Compositional ratio (mass %) | EH-EG (eV) | Lumimmce life (relative value) | CIE chromaticity coordinates (x, y) |
| | | | Material | ΔS(eV) | ΔE(eV) | | | | |
| Example D21 | D21 | H2 | G2 | 0.009 | 0.052 | 99/1 | 0.052 | 2.2 | (0.15, 0.07) |
| Example D22 | D22 | H2 | G4 | 0 | 0.027 | 99/1 | −0.027 | 2.2 | (0.16, 0.10) |
| Example D23 | D23 | H2 | G7 | 0.005 | 0.007 | 99/1 | −0.007 | 1.0 | (0.16, 0.07) |

Examples D24 to D26 and Comparative Example CD6

Making and Evaluation of Light-Emitting Elements D24 to D26 and Comparative Example CD6

Light-emitting elements D24 to D26 and CD6 were made in the same manner as in Example D1, except that the materials described in Table 5 were used instead of "the compound H1 and the compound G2 (compound H1/compound G2=99 mass %/1 mass %)" in (Formation of light-emitting layer) in Example D1.

A voltage was applied to the light-emitting elements D24 to D26 and CD6, so that EL emission was observed. At 100 mA/cm$^2$, CIE chromaticity coordinates (x, y) were measured. In addition, under a constant current drive at 100 mA/cm$^2$, the time periods until the luminance reached 50% of the initial luminance were measured.

Results in Examples D24 to D26 and CD6 are shown in Table 5. When the time period until the luminance of the light-emitting element CD6 reached 50% of the initial luminance (luminance life) was taken as 1.0, the relative values of the time period until the luminance of the light-emitting elements D24 to D26 reached 50% of the initial luminance (luminance life) are shown.

TABLE 5

| | Light-emitting element | Light-emitting layer | | | | | | | |
|---|---|---|---|---|---|---|---|---|---|
| | | Host material | Guest material | | | Compositional ratio (mass %) | EH-EG (eV) | Luminance life (relative value) | CIE chromaticity coordinates (x, y) |
| | | | Material | ΔS(eV) | ΔE(eV) | | | | |
| Example D24 | D24 | HP2 | G4 | 0 | 0.079 | 99/1 | −0.079 | 9.2 | (0.15, 0.08) |
| Example D25 | D25 | HP2 | G7 | 0.005 | 0.059 | 99/1 | −0.059 | 26.6 | (0.15, 0.07) |
| Example D26 | D25 | HP2 | G1 | 0.027 | 0.013 | 99/1 | 0.013 | 45.7 | (0.15, 0.06) |
| Comparative Example CD6 | CD6 | H3 | G1 | 0.027 | 0.549 | 99/1 | 0.549 | 1.0 | (0.15, 0.04) |

Examples D27 to D29

Making and Evaluation of Light-Emitting Elements D27 to D29

Light-emitting elements D27 to D29 were made in the same manner as in Example D1, except that the materials described in Table 6 were used instead of "the compound H1 and the compound G2 (compound H1/compound G2=99 mass %/1 mass %)" in (Formation of light-emitting layer) in Example D1.

A voltage was applied to the light-emitting elements D27 to D29, so that EL emission was observed. At 100 mA/cm$^2$, CIE chromaticity coordinates (x, y) were measured. In addition, under a constant current drive at 100 mA/cm$^2$, the time periods until the luminance reached 80% of the initial luminance were measured.

Results in Examples D27 to D29 are shown in Table 6. When the time period until the luminance of the light-emitting element D27 reached 80% of the initial luminance (luminance life) was taken as 1.0, the relative values of the time period until the luminance of the light-emitting elements D28 and D29 reached 80% of the initial luminance (luminance life) are shown.

TABLE 6

| | Light-emitting element | Light-emitting layer | | | | | | | |
|---|---|---|---|---|---|---|---|---|---|
| | | Host material | Guest material | | | Compositional ratio (mass %) | EH-EG (eV) | Luminance life (relative value) | CIE chromaticity coordinates (x, y) |
| | | | Material | ΔS(eV) | ΔE(eV) | | | | |
| Example D27 | D27 | H4 | G7 | 0.005 | 0.072 | 99/1 | −0.072 | 1.0 | (0.16, 0.21) |
| Example D28 | D28 | H4 | G3 | 0.043 | 0.052 | 99/1 | −0.052 | 1.2 | (0.16, 0.20) |
| Example D29 | D29 | H4 | G1 | 0.027 | 0.000 | 99/1 | 0.000 | 1.2 | (0.16, 0.21) |

INDUSTRIAL APPLICABILITY

According to the present invention, a composition useful for producing a light-emitting element excellent in luminance life can be provided. Since the production of the light-emitting element excellent in luminance life has effects on resource saving, energy saving, etc., the present invention is industrially applicable.

The invention claimed is:

1. A method for producing a composition for a light-emitting element comprising:
   - a preparation step of preparing a host material, the host material being a compound comprising at least one selected from the group consisting of an aromatic hydrocarbon group and a heterocyclic group;
   - a selection step of selecting a guest material, the guest material being a compound having a condensed heterocyclic group comprising a boron atom, and at least one selected from the group consisting of an oxygen atom, a sulfur atom, a selenium atom, an sp$^3$ carbon atom, and a nitrogen atom in a ring, wherein a difference ΔS between an energy value at the maximum peak of an emission spectrum at 25° C. and an energy value at the maximum peak of an emission spectrum at 77 K is 0.10 eV or less, and a difference ΔE between an energy value at a peak on the lowest energy side of an absorption spectrum at 25° C. and an energy value at the maximum peak of an emission spectrum of the host material at 25° C. is 0.50 eV or less; and
   - a production step of mixing the host material and the guest material to obtain the composition for a light-emitting element.

2. The method for producing a composition for a light-emitting element according to claim 1, further comprising a step of obtaining an energy value at the maximum peak of the emission spectrum of the host material at 25° C.

3. The method for producing a composition for a light-emitting element according to claim 1, wherein the selection step comprises a step of obtaining an energy value at the peak on the lowest energy side of an absorption spectrum at 25° C., an energy value at the maximum peak of a light emitting spectrum at 25° C., and an energy value at the maximum peak of a light emitting spectrum at 77 K each of the compound having a condensed heterocyclic group to calculate the ΔF and the ΔS.

4. A method for producing a light-emitting element having an anode, a cathode, and a layer disposed between the anode and the cathode, the method comprising:
   - a step of producing a composition for a light-emitting element by the production method according to claim 1; and
   - a step of forming the layer by a dry method or a wet method using the composition for a light-emitting element produced in the step.

5. A method for evaluating a composition for a light-emitting element, the composition containing: a host material, the host material being a compound comprising at least one selected from the group consisting of an aromatic hydrocarbon group and a heterocyclic group; and a guest material, the guest material being a compound having a condensed heterocyclic group comprising a boron atom, and at least one selected from the group consisting of an oxygen atom, a sulfur atom, a selenium atom, an sp$^3$ carbon atom, and a nitrogen atom in a ring, the method comprising:
   - a step of obtaining a difference ΔE between an energy value at the maximum peak of an emission spectrum of the host material at 25° C. and an energy value at a peak on the lowest energy side of an absorption spectrum of the guest material at 25° C.;
   - a step of obtaining a difference ΔS between an energy value at the maximum peak of an emission spectrum of the guest material at 25° C. and an energy value at the maximum peak of an emission spectrum of the guest material at 77 K; and
   - a step of evaluating the composition for a light-emitting element based on the AE and the ΔS.

* * * * *